United States Patent
Hussein

(10) Patent No.: US 11,556,055 B2
(45) Date of Patent: Jan. 17, 2023

(54) SYSTEMS AND METHODS FOR GENERATING DROP PATTERNS

(71) Applicant: CANON KABUSHIKI KAISHA, Tokyo (JP)

(72) Inventor: Ahmed M. Hussein, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 84 days.

(21) Appl. No.: 16/906,805

(22) Filed: Jun. 19, 2020

(65) Prior Publication Data

US 2021/0397082 A1    Dec. 23, 2021

(51) Int. Cl.
- G03F 7/00 (2006.01)
- B41J 2/045 (2006.01)
- G03F 7/20 (2006.01)
- B82Y 10/00 (2011.01)

(52) U.S. Cl.
CPC ............ *G03F 7/0002* (2013.01); *G03F 7/707* (2013.01); *G03F 7/70866* (2013.01); *B41J 2/04561* (2013.01); *B82Y 10/00* (2013.01)

(58) Field of Classification Search
CPC .... B41J 2/04561; B82Y 10/00; G03F 7/0002; G03F 7/707; G03F 7/70866
See application file for complete search history.

(56) References Cited

U.S. PATENT DOCUMENTS

| | | | |
|---|---|---|---|
| 6,074,430 A | 6/2000 | Tsukiboshi | |
| 6,292,809 B1 | 9/2001 | Edelman | |
| 7,014,295 B2 | 3/2006 | Hickman | |
| 8,119,052 B2 | 2/2012 | Schumaker | |
| 8,232,903 B2 | 7/2012 | Hsu | |
| 8,512,797 B2 | 8/2013 | Schumaker | |
| 8,586,126 B2 | 11/2013 | Schumaker | |
| 9,483,588 B2 | 11/2016 | Nehme | |
| 10,417,820 B2 | 9/2019 | Samavati | |
| 11,215,921 B2 * | 1/2022 | Thompson | .......... H01L 21/0271 |
| 2005/0106321 A1 * | 5/2005 | McMackin | ........... G03F 7/0002 427/532 |
| 2007/0005550 A1 | 1/2007 | Klein | |
| 2010/0097590 A1 * | 4/2010 | Schumaker | ............ B82Y 40/00 358/1.9 |

(Continued)

FOREIGN PATENT DOCUMENTS

| | | |
|---|---|---|
| JP | 2007516862 A | 6/2007 |
| JP | 2015153953 A | 8/2015 |

*Primary Examiner* — Deoram Persaud
(74) *Attorney, Agent, or Firm* — Canon U.S.A., Inc. IP Division

(57) ABSTRACT

Devices, systems, and methods (a) receive a predetermined fluid drop volume and an array of cells, wherein each cell in the array is associated with a respective predetermined fluid volume; (b) scan the array of cells according to a scanning sequence for a next unassigned cell and add the next unassigned cell to a respective fill set; (c) add unassigned cells neighboring the next unassigned cell to the respective fill set until an aggregate of the respective predetermined fluid volumes of the cells in the respective fill set equals or exceeds the predetermined fluid drop volume; (d) place a fluid drop in the drop pattern within an area associated with the respective fill set and mark all cells in the respective fill set as assigned; and (e) repeat (b)-(d) until all cells in the array of cells have been assigned and the drop pattern has been generated.

20 Claims, 22 Drawing Sheets

(56) References Cited

U.S. PATENT DOCUMENTS

| | | | | |
|---|---|---|---|---|
| 2015/0234287 A1* | 8/2015 | Tanaka | ............ | G03F 7/0002 355/27 |
| 2019/0351589 A1 | 11/2019 | Aihara | | |
| 2021/0370558 A1* | 12/2021 | Ishida | ............ | B29C 43/58 |
| 2021/0405547 A1* | 12/2021 | Hussein | ............ | B82Y 10/00 |

* cited by examiner

SYSTEMS AND METHODS FOR GENERATING DROP PATTERNS

BACKGROUND

Technical Field: This application generally concerns generating drop patterns for imprint lithography.

Background: Nano-fabrication includes the fabrication of very small structures that have features that are 100 nanometers or smaller. One application of nano-fabrication is the fabrication of integrated circuits. The semiconductor-processing industry continues to strive for larger production yields while increasing the circuits per unit area formed on a substrate. Improvements in nano-fabrication include providing greater process control and improving throughput while also allowing continued reduction of the minimum feature dimensions of the structures formed.

One nano-fabrication technique is commonly referred to as nanoimprint lithography. Nanoimprint lithography is useful in a variety of applications including, for example, fabricating one or more layers of integrated devices. Examples of an integrated device include CMOS logic, microprocessors, NAND Flash memory, NOR Flash memory, DRAM memory, MRAM, 3D cross-point memory, Re-RAM, Fe-RAM, STT-RAM, MEMS, and the like. Examples of nanoimprint lithography systems and processes are described in detail in numerous publications, such as U.S. Pat. Nos. 8,349,241, 8,066,930, and 6,936,194.

The nanoimprint lithography technique disclosed in each of the aforementioned patents describes the formation of a relief pattern in a formable material (polymerizable) layer and transferring a pattern corresponding to the relief pattern into or onto an underlying substrate. The patterning process uses a template spaced apart from the substrate, and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device (article) fabrication, including, for example, curing, oxidation, layer formation, deposition, doping, planarization, etching, formable material removal, dicing, bonding, packaging, and the like.

SUMMARY

Some embodiments of a method for generating a drop pattern comprise (a) receiving a predetermined fluid drop volume and an array of cells corresponding to a desired fill area, wherein each cell in the array is associated with a respective predetermined fluid volume, and wherein each cell has a hexagonal shape; (b) scanning the array of cells according to a scanning sequence for a next unassigned cell and adding the next unassigned cell in the scanning sequence to a respective fill set of the next unassigned cell; (c) adding unassigned cells neighboring the next unassigned cell to the respective fill set until an aggregate of the respective predetermined fluid volumes of the cells in the respective fill set equals or exceeds the predetermined fluid drop volume; (d) placing a fluid drop in the drop pattern within an area associated with the respective fill set and marking all cells in the respective fill set as assigned; and (e) repeating (b)-(d) until all cells in the array of cells have been assigned and the drop pattern has been generated.

Some embodiments of an apparatus comprise a substrate chuck configured to hold a substrate; a dispenser configured to supply formable material onto the substrate; and a controller configured to control the dispenser in accordance with a drop pattern of the formable material that indicates drop locations where respective drops of the formable material are to be supplied onto the substrate. Also, the controller is further configured to: (a) receive a fluid drop volume and an array of hexagonal cells corresponding to a desired fill area, wherein each cell in the array is associated with a respective fluid volume; (b) scan the array of hexagonal cells according to a scanning sequence and assigning a first unassigned hexagonal cell in the scanning sequence to a fill set; (c) recursively assign unassigned cells neighboring each assigned cell to the fill set until an aggregate of the respective fluid volumes of the cells in the fill set equals or exceeds the drop volume; (d) place a fluid drop in the drop pattern within an area associated with the fill set; and (e) repeat steps (b)-(d) until all the cells in the array have been assigned and the drop pattern is generated.

Some embodiments of one or more computer-readable storage media store instructions that, when executed by one or more computing devices, cause the one or more computing devices to perform operations that comprise receiving a predetermined fluid drop volume and an array of cells corresponding to a desired fill area, wherein each cell in the array is associated with a respective predetermined fluid volume; scanning the array of cells according to a scanning sequence for a next unassigned cell, adding the next unassigned cell in the scanning sequence to a respective fill set of the next unassigned cell, marking the next unassigned cell as assigned, and calculating a remaining drop volume; adding unassigned neighboring cells of the next unassigned cell to a neighbor list, wherein the neighbor list defines an order of the unassigned neighboring cells; repeatedly performing the following until the remaining drop volume is less than or equal to zero: adding a next unassigned neighboring cell in the neighbor list to the fill set, marking the next unassigned neighboring cell as assigned, adding unassigned neighboring cells of the next unassigned neighboring cell to the neighbor list, and recalculating the remaining drop volume; selecting a drop location in the cells in the fill set; and adding the drop location to a drop pattern.

DESCRIPTION

Figure 1:
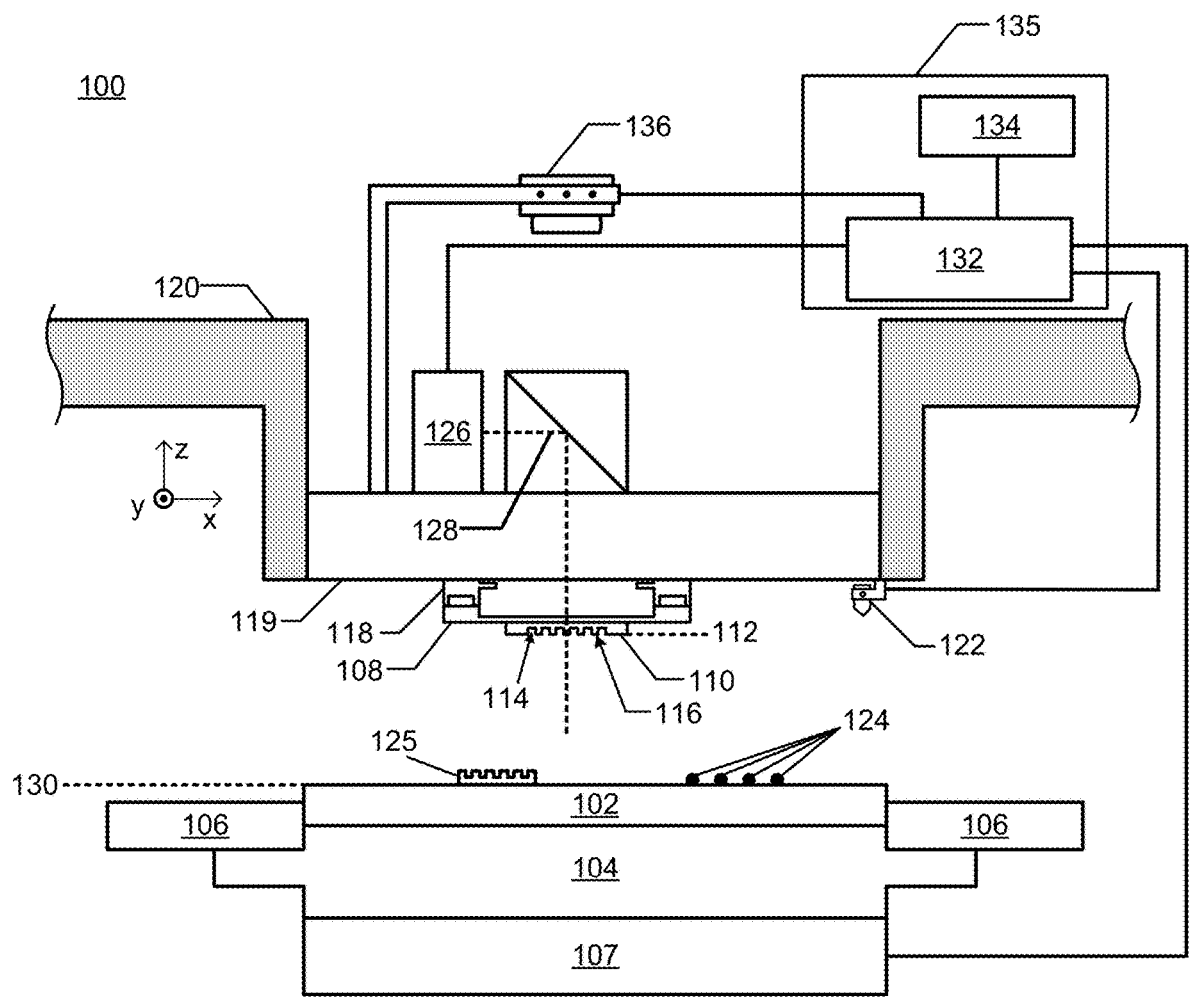
FIG. 1 illustrates an example embodiment of a nanoimprint lithography system.

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments.

Also, as used herein, the conjunction "or" generally refers to an inclusive "or," though "or" may refer to an exclusive "or" if expressly indicated or if the context indicates that the "or" must be an exclusive "or."

Furthermore, in this description and the drawings, an alphabetic suffix on a reference number may be used to indicate a specific instance of the feature identified by the reference numeral. For example, the cells in a group of cells may be identified with the reference numeral 165 when a particular cell is not being distinguished. However, 165A may be used to identify a specific cell when the specific cell is being distinguished from the rest of the cells 165.

FIG. 1 illustrates an example embodiment of a nanoimprint lithography system 100. When operating, the nanoimprint lithography system 100 deposits drops 124 of formable material (e.g., resist) on a substrate 102 (e.g., a wafer) and forms a patterned layer 125, which has a relief pattern, in the formable material in an imprint field on the substrate 102 by using a template 108, that has a mesa (also referred to as a mold) 110 that has a patterning surface 112, to imprint the formable material on the substrate 102. A single mesa 110 may be used to imprint formable material in a plurality of imprint fields on a single substrate 102 or a plurality of substrates 102.

In the embodiment in FIG. 1, the perimeter of the substrate 102 is surrounded by an applique 106. The applique 106 may be configured to stabilize the local gas environment beneath the template 108 and/or help protect the patterning surface 112 from particles, for example when the template is not above the substrate surface 130. Furthermore, an upper surface of the applique 106 may be below (e.g., as shown in FIG. 1) or coplanar with the substrate surface 130.

Also, the substrate 102 is coupled to a substrate chuck 104, which also supports the applique 106. Examples of substrate chucks 104 include the following: vacuum chucks, pin-type chucks, groove-type chucks, electrostatic chucks, and electromagnetic chucks. In some embodiments, such as the embodiment shown in FIG. 1, the applique 106 is mounted on the substrate chuck 104 without any part of the applique being sandwiched between the substrate chuck 104 and the substrate 102. The substrate chuck 104 is supported by the substrate positioning stage 107.

The substrate positioning stage 107 may provide translational or rotational motion along one or more of the x, y, z, θ, and φ-axes. The substrate positioning stage 107, the substrate 102, and the substrate chuck 104 may also be positioned on a base (not shown). Additionally, the substrate positioning stage 107 may be a part of a positioning system or a positioning subsystem.

The nanoimprint lithography system 100 also includes a template 108. The template 108 may include a body that includes the mesa 110 (also referred to as a mold), which extends toward the substrate 102 along the z axis. The mesa 110 may have a patterning surface 112 thereon. Also, the template 108 may be formed without the mesa 110. Thus, in some embodiments, the surface of the template 108 that faces the substrate 102 functions as the mesa 110, and the patterning surface 112 is included on the surface of the template 108 that faces the substrate 102. Examples of materials that may constitute the template 108 or the mesa 110 include the following: fused-silica, quartz, silicon, organic polymers, siloxane polymers, borosilicate glass, fluorocarbon polymers, metal, and hardened sapphire.

The patterning surface 112 has features that are defined by a plurality of spaced-apart template recesses 114 or template protrusions 116, though some embodiments include other configurations (e.g., a planar surface). The patterning surface 112 defines a pattern that forms the basis (e.g., an inverse) of the relief pattern of the patterned layer 125, which is formed from the drops 124 of formable material on the substrate 102. In some embodiments, the patterning surface 112 is featureless, in which case a planar surface is formed from formable material on the substrate 102. In some embodiments (e.g., embodiments that perform Inkjet-based Adaptive Planarization), the patterning surface 112 is featureless and the substantially the same size as the substrate 102, in which case a planar surface is formed from formable material across the entire substrate 102.

The template 108 may be coupled to a template chuck 118. Examples of template chucks 118 include the following: vacuum chucks, pin-type chucks, groove-type chucks, electrostatic chucks, and electromagnetic chucks. The template chuck 118 may be configured to apply a force to the template 108 that varies across the template 108. The template chuck 118 may be coupled to an imprint head 119, which in turn may be moveably coupled to a bridge 120 such that the template chuck 118, the imprint head 119, and the template 108 are moveable in at least the z-axis direction. In some embodiments, the template chuck 118, the imprint head 119, and the template 108 are also movable in one or more of the x, y, θ, and φ-axes directions. The nanoimprint lithography system 100 may include one or more motors that move the template 108, the template chuck 118, or the imprint head 119.

The nanoimprint lithography system 100 also includes a fluid dispenser 122. The fluid dispenser 122 may also be moveably coupled to the bridge 120. In some embodiments, the fluid dispenser 122 and the template chuck 118 share one or more positioning components. And in some embodiments, the fluid dispenser 122 and the template chuck 118 move independently of each other.

When operating, the fluid dispenser 122 deposits drops 124 of liquid formable material onto the substrate 102 according to a drop pattern. The formable material may be, for example, a resist (e.g., photo resist) or another polymerizable material, and the formable material may comprise a mixture that includes a monomer.

The drops 124 of formable material may be dispensed upon the substrate 102 before or after a desired volume is defined between the patterning surface 112 and the substrate 102, depending on design considerations. Different fluid dispensers 122 may use different technologies to dispense the drops 124. When the formable material is jettable, ink-jet-type fluid dispensers 122 may be used to dispense the drops 124 of formable material. For example, thermal ink jetting, microelectromechanical-systems-based (MEMS-based) ink jetting, and piezoelectric ink jetting are technologies for dispensing jettable liquids.

Furthermore, additional formable material may be added to the substrate 102 using various techniques, for example drop dispense, spin-coating, dip coating, chemical vapor deposition (CVD), physical vapor deposition (PVD), thin film deposition, thick film deposition, or the like.

The nanoimprint lithography system 100 also includes an energy source 126 that directs actinic energy along an exposure path 128. The imprint head 119 and the substrate positioning stage 107 may be configured to position the template 108 and the substrate 102 on (e.g., in superimposition with) the exposure path 128. A camera 136 may likewise be positioned such that an imaging field of the camera 136 is in superimposition with at least part of the exposure path 128.

Once the drops 124 of formable material have been deposited on the substrate, either the imprint head 119, the substrate positioning stage 107, or both varies a distance between the mesa 110 and the substrate 102 to define a desired field volume that is filled by the formable material. For example, the imprint head 119 may apply a force to the template 108 that moves the mesa 110 into contact with the drops 124 of formable material that are on the substrate 102. After the desired field volume is filled with the formable material, the energy source 126 produces energy (e.g., actinic radiation (UV)) that is directed along the exposure path 128 to the formable material and that causes the formable material to cure, solidify, or cross-link in conformance to a shape of the substrate surface 130 and the patterning surface 112, thereby defining a patterned layer 125 on the substrate 102. The formable material is cured while the template 108 is in contact with the formable material, thereby forming the patterned layer 125 on the substrate 102. Thus, the nanoimprint lithography system 100 uses an imprinting process to form the patterned layer 125, which has recesses and protrusions that are an inverse of the pattern in the patterning surface 112.

The imprinting process may be done repeatedly in a plurality of imprint fields (e.g., the imprint fields 141 in FIG. 2) that are spread across the substrate surface 130. For example, each of the imprint fields may be the same size as the mesa 110 or the same size as only the pattern area 115 of the mesa 110. The pattern area 115 of the mesa 110 is a region of the patterning surface 112 that is used to imprint patterns on a substrate 102 (e.g., a region that includes the template recesses 114 and the template protrusions 116). The pattern area 115 of the mesa 110 may include fluid control features that are used to prevent extrusions. In some embodiments, the substrate 102 has only one imprint field, and the imprint field is the same size as the substrate 102 or as the area of the substrate 102 which is to be patterned with the mesa 110. Also, in some embodiments, the imprint fields overlap. Some of the imprint fields may be partial imprint fields which intersect a boundary of the substrate 102.

The patterned layer 125 may be formed such that it has a residual layer that has a residual layer thickness (RLT) above a highest point on the substrate surface 130 in each imprint field. The patterned layer 125 may also include one or more features, such as protrusions, that extend above the residual layer. These protrusions match the recesses 114 in the patterning surface 112 of the mesa 110.

The patterned layer 125 can be further subjected to known steps and processes for article (e.g., device) fabrication, including, for example, curing, oxidation, layer formation, deposition, doping, planarization, etching, formable material removal, dicing, bonding, packaging, and the like. Examples of articles include CMOS logic, microprocessors, NAND Flash memory, NOR Flash memory, DRAM memory, MRAM, 3D cross-point memory, Re-RAM, Fe-RAM, STT-RAM, and MEMS.

The nanoimprint lithography system 100 may be regulated, controlled, or directed by one or more processors 132 (e.g., controllers) in communication with one or more other components or subsystems, such as the substrate positioning stage 107, the imprint head 119, the fluid dispenser 122, the energy source 126, or the camera 136, and may operate based on instructions in a computer-readable program stored in one or more non-transitory computer-readable media 134. In some embodiments, including the embodiment in FIG. 1, the one or more processors and the one or more non-transitory computer-readable media 134 are included in a nanoimprint-lithography-control device 135. The nanoimprint-lithography-control device 135 regulates, controls, or directs the operations of the nanoimprint lithography system 100.

Each of the one or more processors 132 may be or may include one or more of the following: a central processing units (CPU), which may include microprocessors (e.g., a single core microprocessor, a multi-core microprocessor); a graphics processing unit (GPUs); an application-specific integrated circuit (ASIC); a field-programmable-gate array (FPGA); a digital signal processors (DSP); a specially-configured computer; and other electronic circuitry (e.g., other integrated circuits). For example, a processor 132 may be a purpose-built controller or may be a general-purpose controller that has been specially-configured to be a nanoimprint-lithography-system controller.

Examples of non-transitory computer-readable media include, but are not limited to, a magnetic disk (e.g., a floppy disk, a hard disk), an optical disc (e.g., a CD, a DVD, a Blu-ray), a magneto-optical disk, magnetic tape, semiconductor memory (e.g., a non-volatile memory card, flash memory, a solid-state drive, SRAM, DRAM, EPROM, EEPROM), a networked attached storage (NAS), an intranet-connected non-transitory computer-readable storage device, and an internet-connected non-transitory computer-readable storage device.

In the embodiment in FIG. 1, the nanoimprint-lithography-control device 135 may generate one or more drop patterns, and the nanoimprint-lithography-control device 135 may obtain the one or more drop patterns from another device (e.g., a drop-pattern-generation device) that generated the one or more drop patterns. For example, the one or more processors 132 may be in communication with a networked computer on which analysis is performed and control files, such as a drop pattern, are generated. A drop pattern indicates where the fluid dispenser 122 should deposit drops 124 of liquid formable material onto the substrate 102. A drop pattern may be generated based on a field volume and on imprint-field features. The field volume indicates the volume of formable material required to produce all of the desired features of the patterned layer 125 (e.g., all of the features of the patterned layer 125 in an imprint field). Also, to account for imprint-field features, the density of the drop pattern may vary across the imprint field. And the drop pattern may have a uniform drop density over regions of the imprint field that have a uniform density (e.g., blank areas, or areas where the imprint-field features have a uniform feature density).

Figure 2:
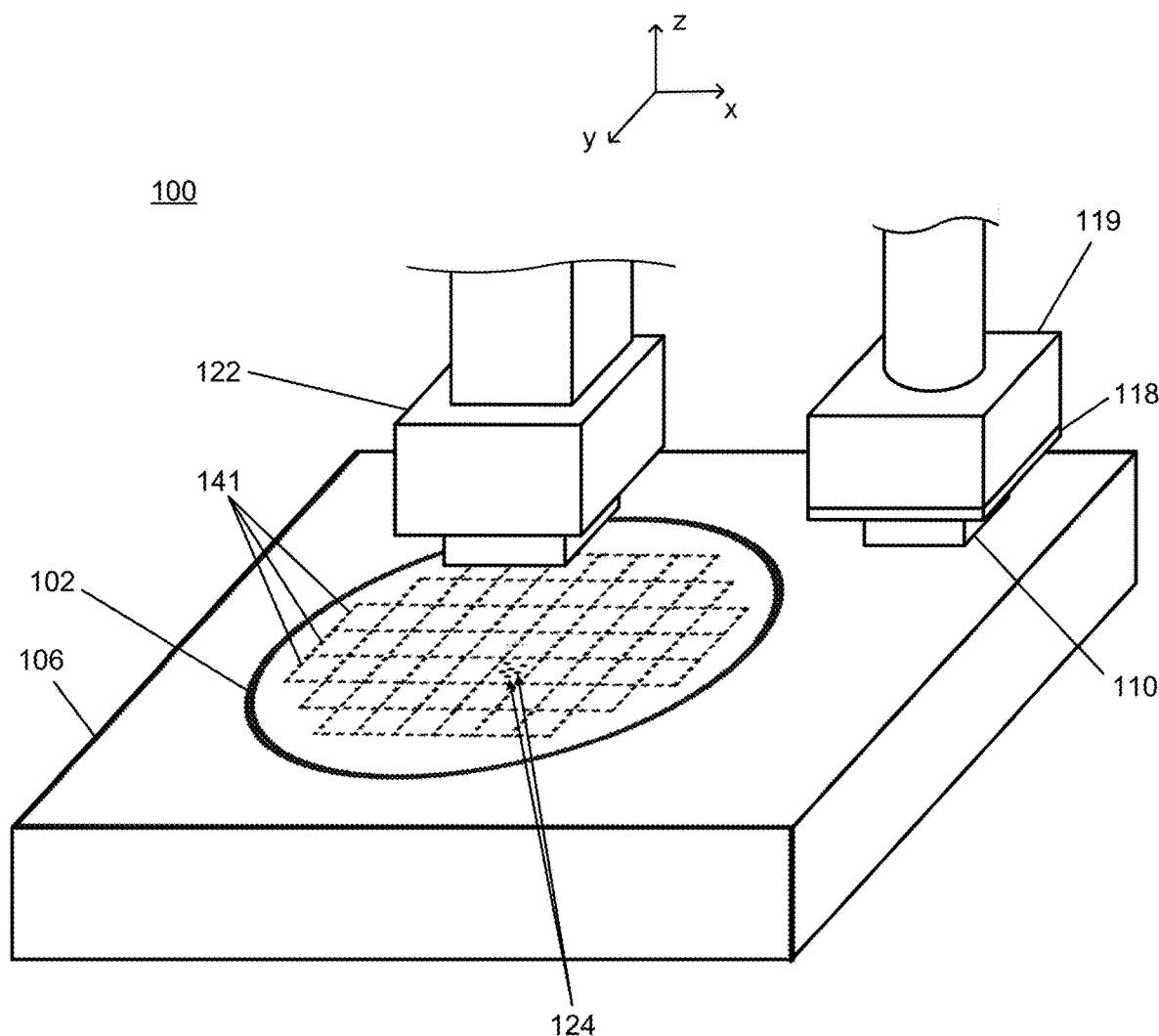
FIG. 2 illustrates a perspective view of an example embodiment of a nanoimprint lithography system.

FIG. 2 illustrates a perspective view of an example embodiment of a nanoimprint lithography system 100. This embodiment of a nanoimprint lithography system 100 includes a substrate 102, an applique 106, a fluid dispenser 122, a mesa 110, a template chuck 118, and an imprint head 119. Also, FIG. 2 illustrates a plurality of imprint fields 141 on the substrate 102. Additionally, the fluid dispenser 122 has deposited drops 124 of formable material on one of the imprint fields 141.

Figure 3:
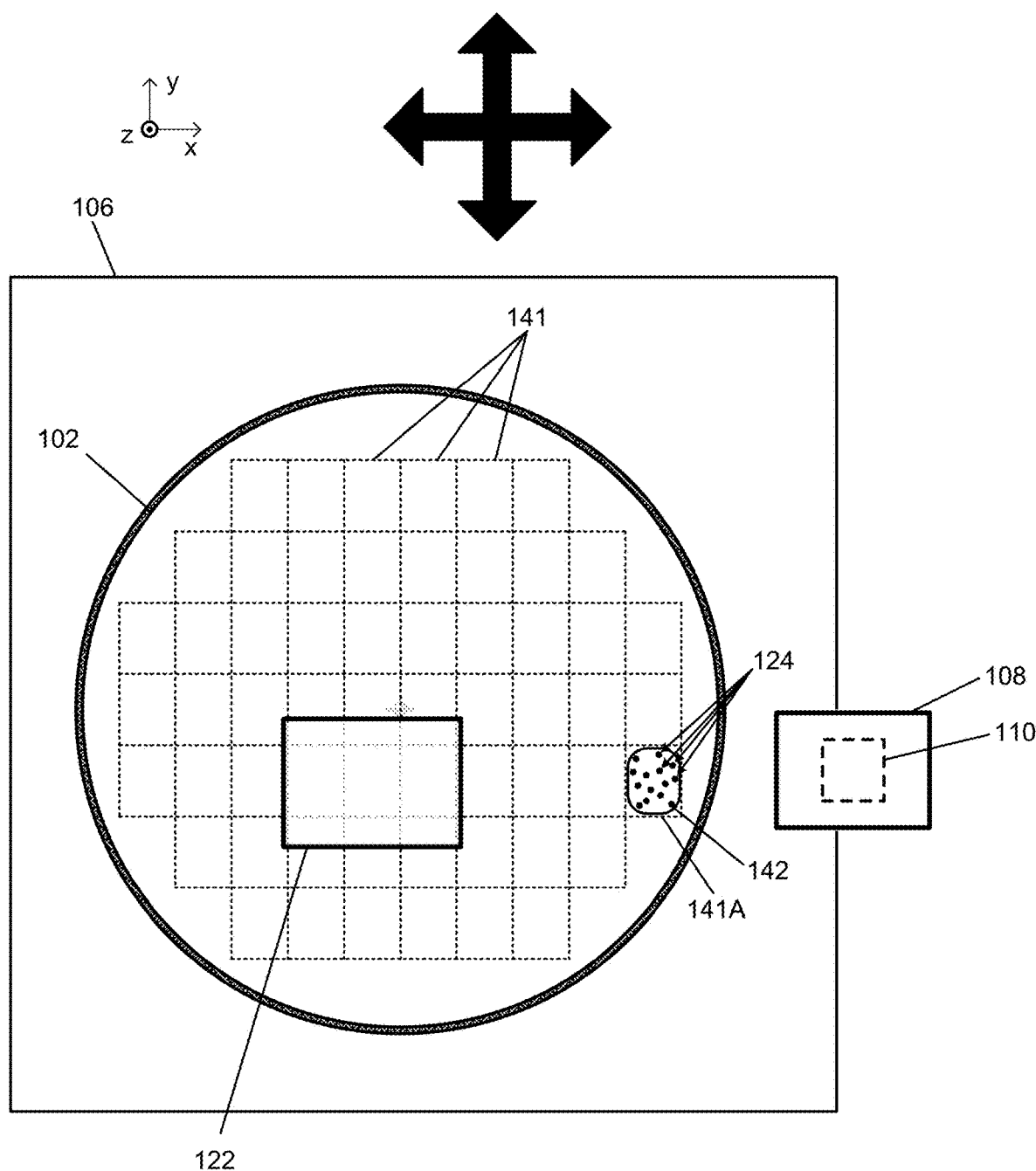
FIG. 3 illustrates a plan view (a view from along the z axis) of an example embodiment of a substrate, an applique, a fluid dispenser, a template, and a drop pattern.

FIG. 3 illustrates a plan view (a view from along the z axis) of an example embodiment of a substrate 102, an applique 106, a fluid dispenser 122, a template 108, and a drop pattern 142. The template 108 includes a mesa 110. The substrate 102 in FIG. 3 includes a plurality of imprint fields 141. On each of the imprint fields 141, a respective pattern may be formed from formable material (e.g., a patterned layer or a planar layer). The substrate positioning stage that supports the applique 106 and the substrate 102 can move the applique 106 and the substrate 102 along both the x axis and the y axis. This allows the substrate positioning stage to position each of the imprint fields 141 under the fluid dispenser 122, which deposits drops of formable material on the imprint field 141, and then under the template 108, which forms a pattern (e.g., a patterned layer) in the formable material that was deposited on the imprint field 141. In some embodiments, there is only one imprint field on the substrate surface.

When an imprint field 141 is positioned under the fluid dispenser 122, the fluid dispenser 122 can deposits drops 124 of formable material on the imprint field 141. For example, FIG. 3 shows an imprint field 141A on which drops 124 of formable material have been deposited by the fluid dispenser 122 according to a drop pattern 142. In some embodiments, the fluid dispenser 122 deposits the drops 124 on each of the imprint fields 141 according to the same drop pattern 142. However, in some embodiments, the fluid dispenser 122 uses different drop patterns for some of the imprint fields 141.

Figure 4:
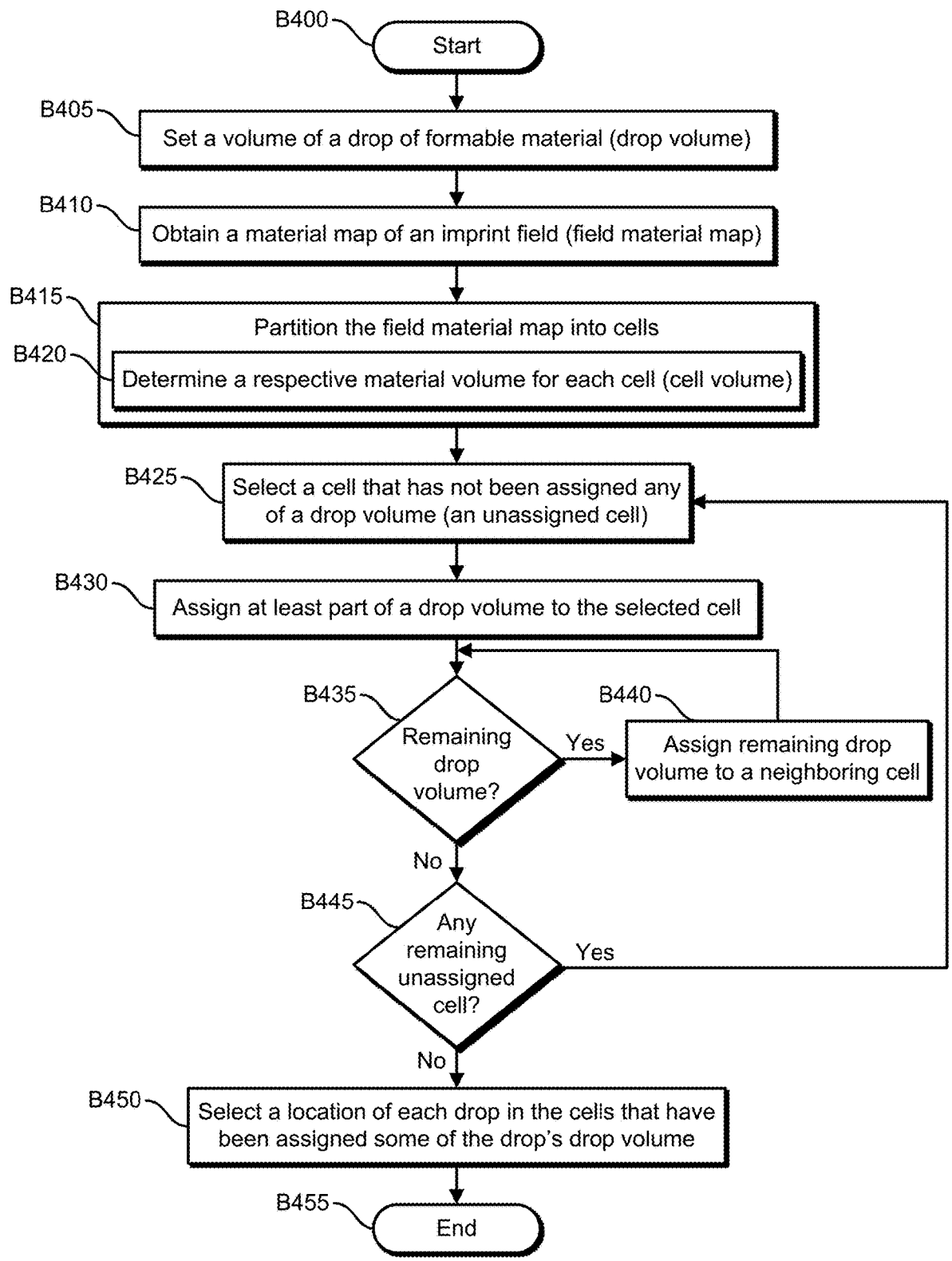
FIG. 4 illustrates an example embodiment of an operational flow for generating a drop pattern.

FIG. 4 illustrates an example embodiment of an operational flow for generating a drop pattern. Although this operational flow and the other operational flows that are described herein are each presented in a certain respective order, some embodiments of these operational flows perform at least some of the operations in different orders than the presented orders. Examples of different orders include concurrent, parallel, overlapping, reordered, simultaneous, incremental, and interleaved orders. Also, some embodiments of these operational flows include operations (e.g., blocks) from more than one of the operational flows that are described herein. Thus, some embodiments of the operational flows may omit blocks, add blocks (e.g., include blocks from other operational flows that are described herein), change the order of the blocks, combine blocks, or divide blocks into more blocks relative to the example embodiments of the operational flows that are described herein.

Furthermore, although this operational flow and the other operational flows that are described herein are performed by a drop-pattern-generation device, some embodiments of these operational flows are performed by two or more drop-pattern-generation devices or by one or more other specially-configured computing devices (e.g., a nanoimprint-lithography-control device).

Figure 5:
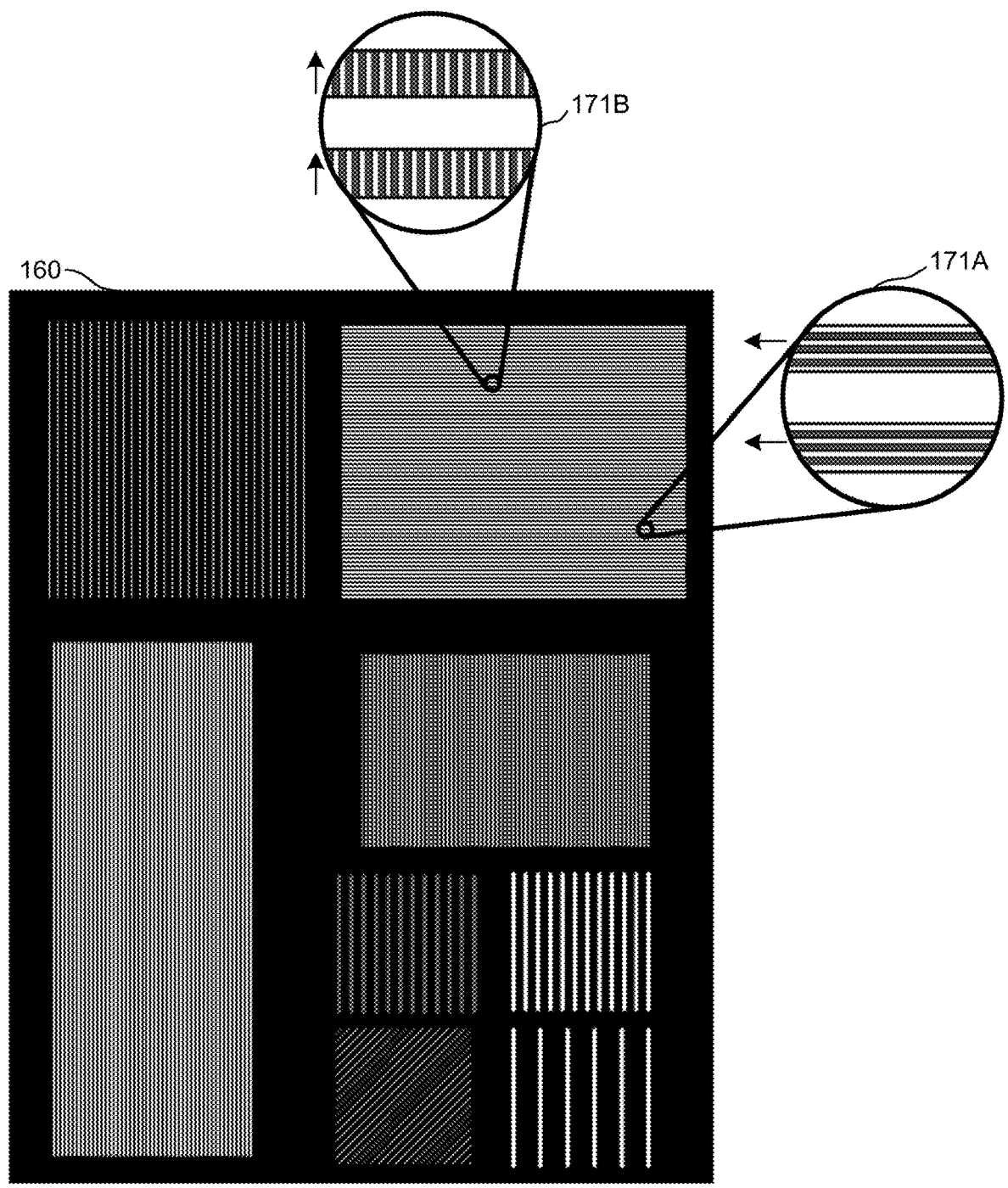
FIG. 5 illustrates an example embodiment of a field material map.

In FIG. 4, the flow starts in block B400 and then proceeds to block B405, where the drop-pattern-generation device sets or obtains (e.g., retrieves, receives) a volume of a drop of formable material (drop volume), which indicates the volume of formable material in a single drop. Depending on the components (e.g., fluid dispenser) of the corresponding nanoimprint lithography system, the drop volume may have a range of possible volumes (e.g., be adjustable), or the drop volume may have a fixed volume. Next, in block B410, the drop-pattern-generation device obtains a material map of one or more imprint fields (a field material map). The field material map may cover an entire substrate, may describe only a single imprint field, or may describe a plurality of imprint fields. For example, a field material map may be an image (e.g., bitmap, PNG) in which the respective value of each tile (e.g., pixel) indicates a volume of imprint material (e.g., a thickness of a patterned layer, such as the patterned layer 125 in FIG. 1). FIG. 5 illustrates an example embodiment of a field material map 160. The different shades in the field material map 160 indicate the respective volumes of imprint material at the locations of the tiles.

Next, in block B415, the drop-pattern-generation device partitions the field material map into a plurality of cells. For example, some embodiments of the drop-pattern-generation device overlay a set (e.g., array, grid, tessellation) of cells on the field material map. The sizes of the cells influence the resolution of the drop pattern and the speed with which the drop-pattern-generation device can generate the drop pattern. Also, the cells may have various shapes (e.g., square, rectangle, triangle, hexagon, octagon, irregular polygons), although, in the following example embodiments, the cells have a hexagonal shape. In some embodiments, not all of the cells have the same shape—thus, different shapes are used together.

Figure 6:
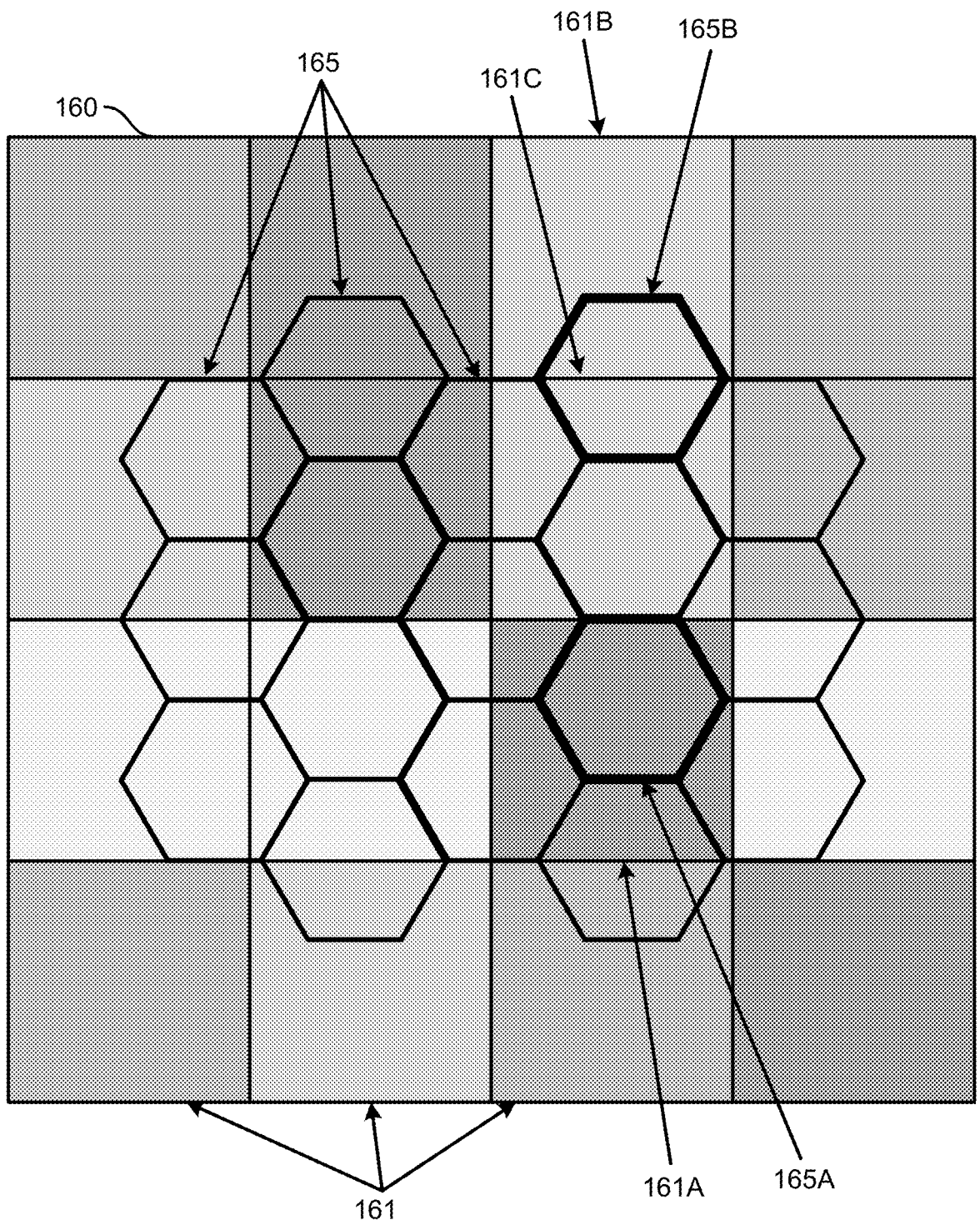
FIG. 6 illustrates an example embodiment of a set of cells overlaid on a field material map.

FIG. 6 illustrates an example embodiment of a set of cells overlaid on a field material map. The field material map 160 includes sixteen tiles 161, and the color of each tile 161 in the field material map 160 indicates the volume of formable material at the location of the tile 161.

Also, in this embodiment, each cell 165 in the set of cells 165 has a hexagonal shape. The hexagonal shape may improve the quality of the resulting drop patterns because rectangular and diamond shapes may be a suboptimal representation of the drop-spreading geometry, which can be isotropic and more circular than rectangular. Using hexagonal cells instead of rectangular or diamond-shaped cells, the isotropic nature of the drop spreading may be better replicated. Also, in some drop patterns, the absolute majority of drops have exactly six abutting neighbor drops, which would occur naturally if each drop region is composed of a set of contiguous hexagonally-shaped cells.

Furthermore, block B415 includes block B420. In block B420, the drop-pattern-generation device determines a respective material volume for each cell (cell volume) and marks each cell as an unassigned cell. A cell volume indicates the volume of formable material that is to be assigned to cell (e.g., assigned in block B430 or in block B440). In some embodiments, the cell volume of a cell is determined to be the sum of the volume of formable material in the areas of the tiles in a field material map that are overlaid by the cell. For example, referring to FIG. 6, if the area of a cell is half the area of a tile, then the cell volume of a first cell 165A will be half of the amount of formable material of the tile 161A that is overlaid by the first cell 165A. Also for example, then the cell volume of a second cell 165B will be the sum of one fourth of the amount of formable material of each of the two tiles 161B-C that are overlaid by a respective half of the second cell 165B. Thus, a tile that is overlaid by multiple cells may have its formable-material volume distributed among all of the overlaying cells, with the fraction of the formable-material volume going to a particular cell equaling the fraction of the tile's area overlaid by the particular cell. Also, the total volume assigned to all of the cells will then be equal to the total volume of all the tiles (and thus equal to the total volume in the field material map).

The flow then moves to block B425, where the drop-pattern-generation device selects an unassigned cell, which is a cell that has not been assigned any part of a drop volume.

Next, in block B430, the drop-pattern-generation device assigns at least part of a drop volume to the selected cell and marks the selected cell as assigned. The drop volume that is assigned to the selected cell is the selected cell's cell volume (e.g., from block B420). The cell volume is less than the drop volume (the cell volume is set so that the largest cell volume is less than the drop volume—the drop volume may be substantially larger than the largest cell volume), a part of the drop volume that is equal to the cell volume is assigned to the selected cell, and a part of the drop volume will remain unassigned.

The flow then moves to block B435, where the drop-pattern-generation device determines if any of the drop volume from block B430 remains unassigned. If the drop-pattern-generation device determines that some of the drop volume from block B430 remains unassigned (B435=Yes), then the flow moves to block B440. In block B440, the drop-pattern-generation device assigns at least some of the remaining drop volume to an unassigned neighboring cell and marks the neighboring cell as assigned. From block B440, the flow returns to block B435. In blocks B435-6440, the drop-pattern-generation device may assign a part of the drop volume that is equal to a neighboring cell's cell volume and then move to another neighboring cell if part of the drop volume remains unassigned, thereby visiting multiple neighboring cells until all of the drop volume has been assigned to a cell.

Also, if the drop-pattern-generation device determines that none of the drop volume from block B430 remains unassigned (B435=No), then the flow moves to block B445.

In block B445, the drop-pattern-generation device determines if there is any remaining unassigned cells. If the drop-pattern-generation device determines that one or more unassigned cells remain (B445=Yes), then the flow returns to block B425. If the drop-pattern-generation device determines that no unassigned cells remain (B445=No), then the flow moves to block B450.

In block B450, the drop-pattern-generation device computes (or otherwise determines) a location of each drop in the cells that have been assigned some of the drop's drop volume. The cells that have been assigned some of a drop's drop volume may be referred to as a drop region. For example, if three cells have been assigned part of a drop's drop volume (the three cell compose the drop region), then the drop-pattern-generation device computes a location within the three cells for the drop. This location indicates where the drop is to be placed in a drop pattern. The drop-pattern-generation device outputs or stores the locations of the drops, which define a drop pattern. Then the flow ends in block B455.

Figure 7:
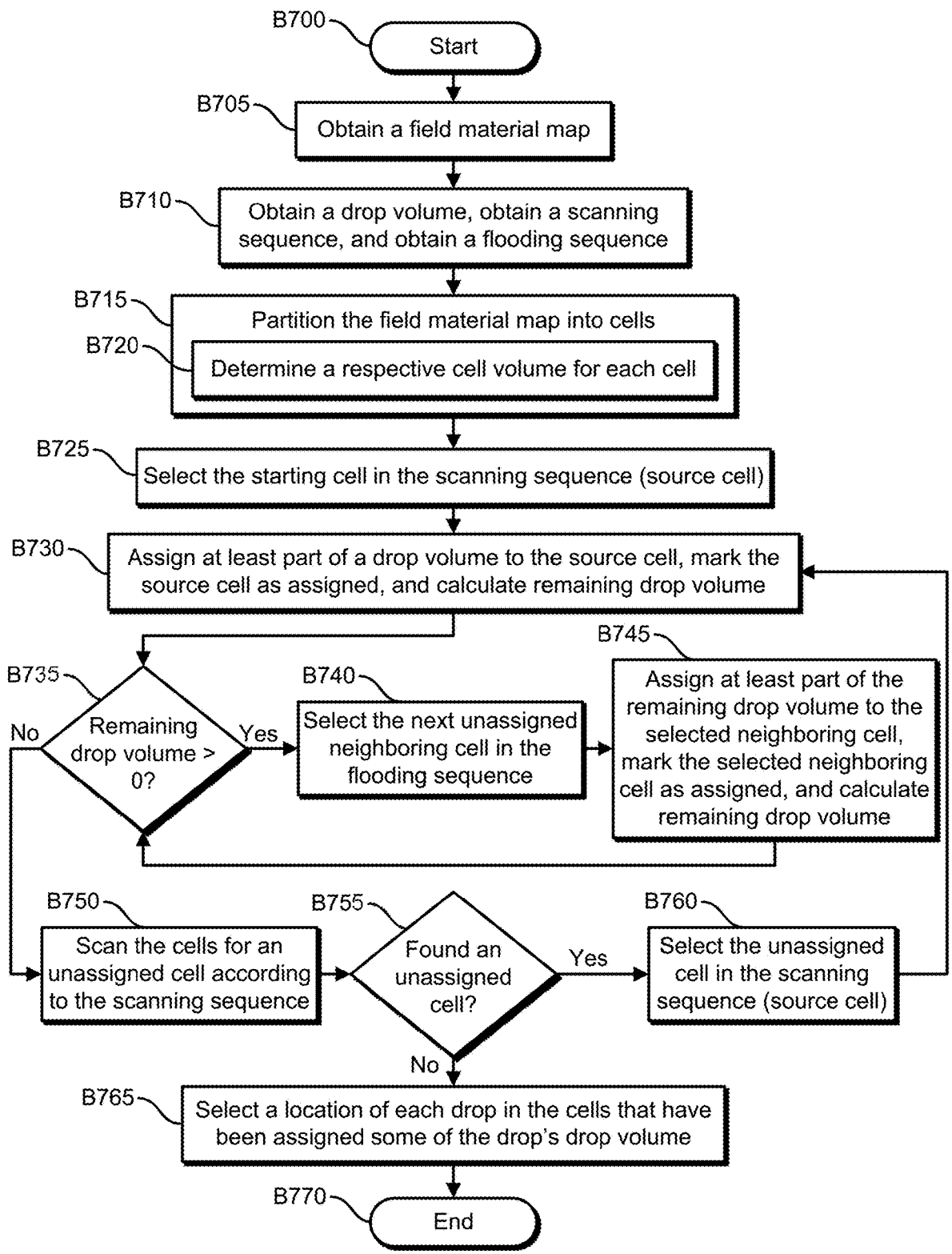
FIG. 7 illustrates an example embodiment of an operational flow for generating a drop pattern.

FIG. 7 illustrates an example embodiment of an operational flow for generating a drop pattern. The flow starts in block B700 and then moves to block B705, where a drop-pattern-generation device obtains a field material map. Next, in block B710, the drop-pattern-generation device sets or obtains (e.g., receives from a user input, retrieves from a memory device) a drop volume, obtains a scanning sequence, and obtains a flooding sequence.

Figure 8A:
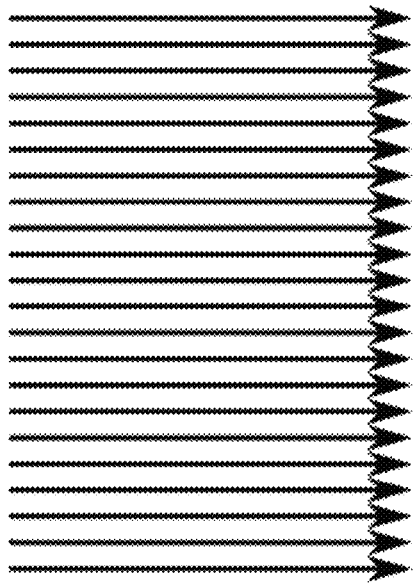
FIGS. 8A-D illustrate example embodiments of scanning sequences.
Figure 8B:
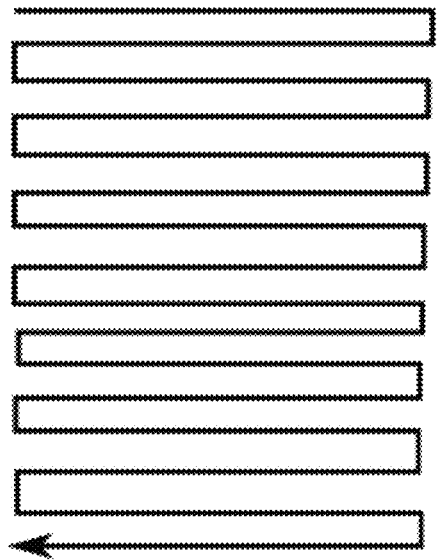
Figure 8C:
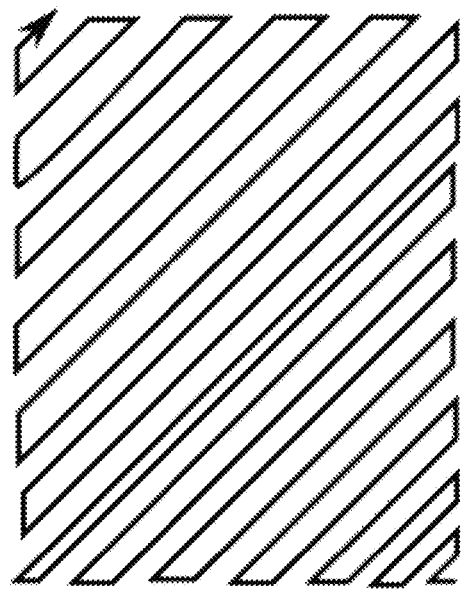
Figure 8D:
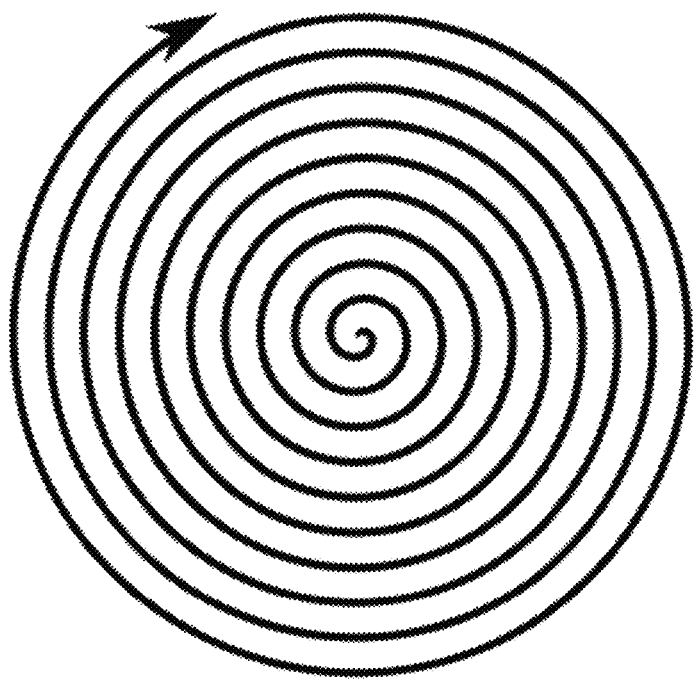

A scanning sequence defines a sequence or order that the drop-pattern-generation device will use to scan a set of cells for any unassigned cells. FIGS. 8A-D illustrate example embodiments of scanning sequences. Each of the scanning sequences in FIGS. 8A-D visit each cell exactly once. The scanning sequence in FIG. 8A is a raster scan that scans a certain row of cells horizontally from left to right and, once the row ends, scans the row above (or below) horizontally from left to right. The scanning sequence in FIG. 8B is a serpentine scan in which the horizontal scanning direction alternates every row. For example, if the cells in a row are scanned horizontally from left to right, then the row above (or below) is scanned horizontally from right to left. The scanning sequence in FIG. 8C is a corner scan. The cell at one corner is scanned and then the scanning proceeds in a direction that makes an angle (which may be specified by a user) with the horizontal direction until a boundary (horizontal or vertical) is encountered. The scanning then goes back in the opposite direction after shifting the scan line one cell size in a direction normal to the scanning direction. The scanning sequence in FIG. 8D is a spiral scan. A cell at or near the center of the cells is scanned first and then the scanning proceeds in a spiral fashion until all cells have been assigned. The pitch of the spiral scan path may be less than or equal to the cell size to guarantee that all cells will be scanned and assigned.

Some embodiments use other scanning sequences. For example, some embodiments use a queue scan, which may follow a non-continuous path or a custom-designed sequence. In a queue scan, the cells are placed in a queue according to a sequence. The sequence visits every cell, but the sequence may not follow a continuous path (e.g., the sequence may jump between cells without visiting the cells in between). During a scan according to the queue scan, a cell is examined and, if the cell has not been assigned to a drop, the cell is assigned to a drop (and may be labeled as a source cell). If the cell has been assigned to a drop, the cell is removed from the queue and the next cell is examined. The queue sequence may be generated before starting the scanning.

Some other embodiments use other scanning sequences that may satisfy the following criteria: (1) The scanning sequence visits each cell and, consequently, each cell will be assigned to a drop. (2) No cell gets visited more than once. (3) Determining which cell to visit next can be performed quickly. In some embodiments, this determination does not depend on the drops that have been generated or on the cells that have been assigned. Also, the determination may be agnostic to the current progress of the scanning and may be memoryless and completely unaware of the current progress of the scanning.

Additionally, a flooding sequence defines a sequence that the drop-pattern-generation device will use to distribute drop volume to the neighbors of a cell (e.g., a cell that was selected according to a scanning sequence). And the shape and the order of the flooding sequence may be configured to assign drop volume to neighboring cells based on the density of the features in the field material map.

Figure 9A:
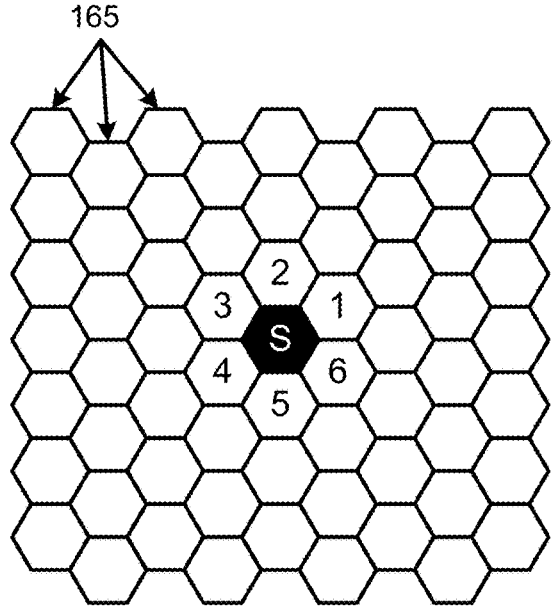
FIGS. 9A-D illustrate example embodiments of flooding sequences.

FIGS. 9A-D illustrate example embodiments of flooding sequences. FIG. 9A shows a selected cell S in a set of cells 165. The selected cell S has six neighboring cells that abut the selected cell S. These six cells, which are numbered from 1 to 6, are included in the flooding sequence. Also, the numbers 1 to 6 indicate the order in which the neighboring cells are visited in the flooding sequence. In this embodiment, the flooding sequence proceeds in a counter-clockwise direction around the selected cell S.

Figure 9B:
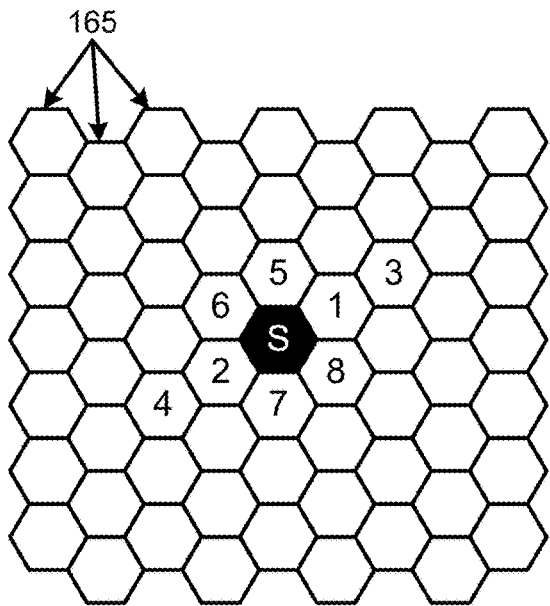

FIG. 9B shows a selected cell S in a set of cells 165. The selected cell S has six neighboring cells that abut the selected cell S, and these six cells are included in the flooding sequence. However, the flooding sequence also includes neighboring cells that do not abut the selected cell S. The neighboring cells are numbered from 1 to 8 to indicate the order in which the neighboring cells are visited in the flooding sequence.

Figure 9C:
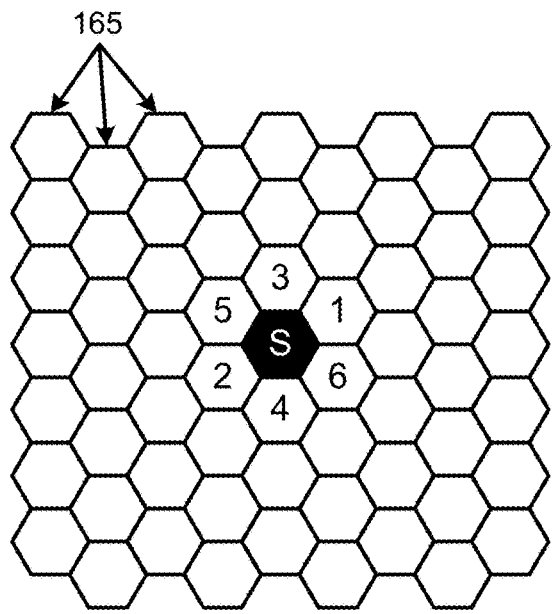

FIG. 9C shows a selected cell S in a set of cells 165. The selected cell S has six neighboring cells that abut the selected cell S, and these six cells are included in the flooding sequence. Also, the neighboring cells are numbered from 1 to 6 to indicate the order in which the neighboring cells are visited in the flooding sequence. And the neighboring cells in FIG. 9C are ordered differently than the neighboring cells in FIG. 9A.

Figure 9D:
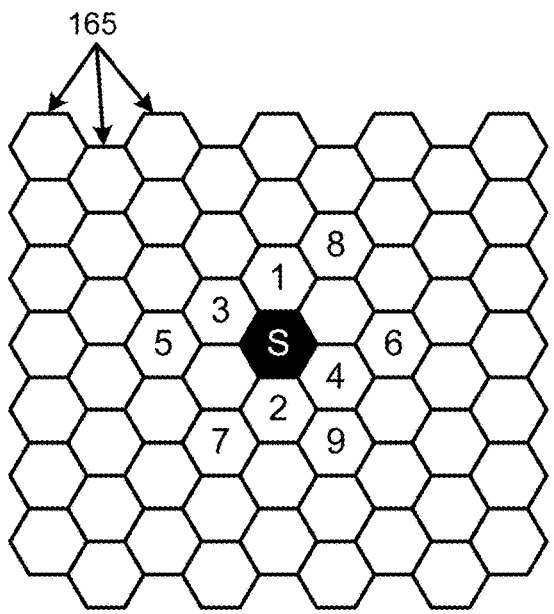

FIG. 9D shows a selected cell S in a set of cells 165. The selected cell S has six neighboring cells that abut the selected cell S, but only four of the abutting neighboring cells are included in the flooding sequence. The other five neighboring cells in the flooding sequence do not abut the selected cell S.

Therefore, as illustrated by FIGS. 9A-D, some flooding sequences are isotropic, and some flooding sequences are anisotropic. Also, additional embodiments of flooding sequences are shown in FIGS. 19A-D.

Also, as indicated by FIGS. 9A-D, if the field imprint patterns favor the flow of drops in a certain direction, the flooding sequence can be configured to grow in the direction favored by the field imprint patterns. The configuration could be achieved by the sequence of cells in the flooding sequence. For example, some embodiments of flooding sequences visit neighboring cells in the favored direction first, followed by their neighboring cells in the favored direction, then the neighboring cells in other directions. The number and sequence of neighboring cells that are in a favored direction can be adjusted to account for how strongly the favored direction is favored relative to other directions. Directionality of patterns and pattern features of a template and/or a substrate may influence the dynamics and directionality of the fluid spread process. For example, a directional pattern, such as a line/space array, can induce fluid to spread far more quickly along a principal axis direction of the array relative to the direction perpendicular to such principal axis direction. The principal axis direction denotes the direction in which recesses with a pitch (that is, for example, 10-80 nm wide) in a patterning surface extend along a length (which, for example, may be at least 20 times the pitch), and, when the liquid formable material fills in the recesses in the patterning surface (e.g., when the patterning surface is lowered onto the formable material), this is the direction in which the liquid formable material most-readily flows (examples of recesses include the recesses 114 in the patterning surface 112 in FIG. 1). For example, if the inverse of the field material map in FIG. 5 (not to scale) was a patterning surface, then the principal axis direction of the recess in a first area 171A would be the x axis direction, and the principal axis direction of the recess in a second area 171B would be they axis direction. In some embodiments, the principal axis denotes the direction in which recesses extend in at least one of the following: the field material map, the patterning surface, and the substrate surface. Directionality may be stored as vector for each cell indicating the direction of preferred flow and the magnitude of the preference.

Referring again to FIG. 7, after block B710, the flow moves to block B715. In block B715, the drop-pattern-generation device partitions the field material map into cells. Block B715 includes block B720, where the drop-pattern-generation device determines a respective cell volume for each cell. The flow then moves to block B725, where the drop-pattern-generation device selects the starting cell in the scanning sequence that was obtained in block B710. A cell that has been selected according to the scanning sequence may be referred to herein as a source cell. Then, in block B730, the drop-pattern-generation device assigns at least part of a drop volume to the source cell and marks the source cell as assigned. If the drop volume is less than or equal to the cell volume, then the drop-pattern-generation device assigns all of the drop volume to the source cell. If the drop volume is greater than the cell volume, then the drop-pattern-generation device assigns a part of the drop volume that is equal to the cell volume to the source cell. Also, the drop-pattern-generation device calculates the remaining drop volume by subtracting the cell volume of the source cell from the drop volume. The flow then moves to block B735, where the drop-pattern-generation device determines if the remaining drop volume is greater than zero. If the drop-pattern-generation device determines that the remaining drop volume is greater than zero (B735=Yes), then the flow moves to block B740.

In block B740, the drop-pattern-generation device selects the next unassigned neighboring cell of the source cell in the flooding sequence. Then, in block B745, the drop-pattern-generation device assigns at least part of the remaining drop volume to the selected neighboring cell and marks the selected neighboring cell as assigned. If the remaining drop volume is less than or equal to the cell volume of the selected neighboring cell, then the drop-pattern-generation device assigns all of the remaining drop volume to the selected neighboring cell. If the remaining drop volume is greater than the cell volume of the selected neighboring cell, then the drop-pattern-generation device assigns a part of the remaining drop volume that is equal to the cell volume of the selected neighboring cell to the selected neighboring cell. Also, the drop-pattern-generation device calculates the remaining drop volume by subtracting the cell volume of the selected neighboring cell from the remaining drop volume. The flow then returns to block B735.

If the drop-pattern-generation device determines that the remaining drop volume is not greater than zero (B735=No), then the flow moves to block B750. In block B750, the drop-pattern-generation device scans the cells for an unassigned cell according to the scanning sequence. Next, in block B755, the drop-pattern-generation device determines if it found an unassigned cell while it scanned the cells according to the scanning sequence. If the drop-pattern-generation device determines that it did find an unassigned cell (B755=Yes), then the flow moves to block B760. Starting from the source cell that was selected in block B725 or in the most-recent previous iteration of block B760, the unassigned cell will be the first unassigned cell in the scanning sequence. In block B760, the drop-pattern-generation device selects the unassigned cell, which thus becomes a source cell. The flow then returns to block B730.

If the drop-pattern-generation device determines that it did not find an unassigned cell in block B755 (B755=No), then the flow moves to block B765. In block B765, for each drop, the drop-pattern-generation device computes a location of the drop in the drop region (the cells that have been assigned some of the drop's drop volume). Also, the drop-pattern-generation device outputs or stores the locations of the drops, which define a drop pattern. The flow then ends in block B770.

Figure 10:
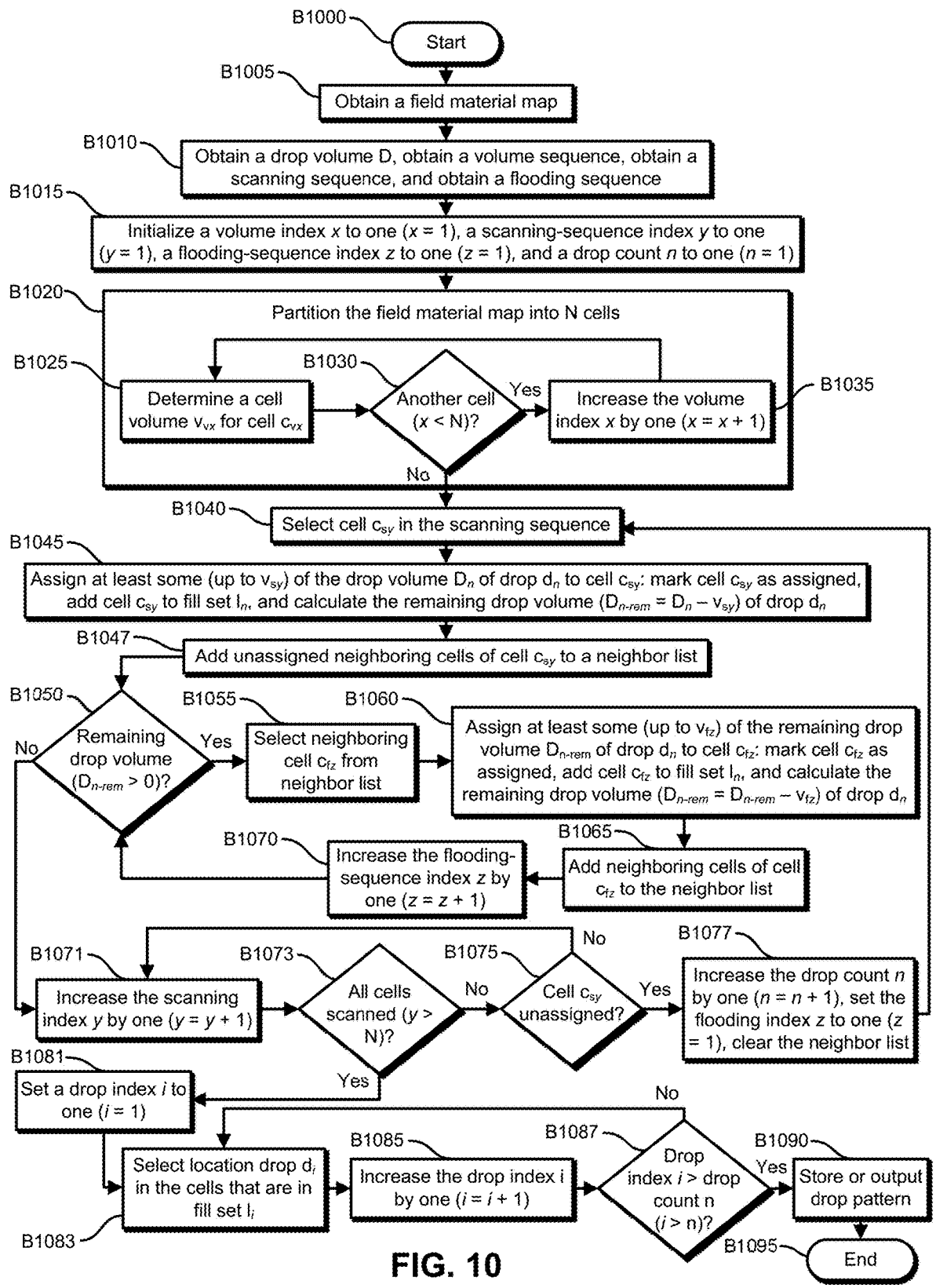
FIG. 10 illustrates an example embodiment of an operational flow for generating a drop pattern.

FIG. 10 illustrates an example embodiment of an operational flow for generating a drop pattern. The flow starts in block B1000 and then moves to block B1005, where a drop-pattern-generation device obtains a field material map. Next, in block B1010, the drop-pattern-generation device obtains a drop volume D, obtains a volume sequence, obtains a scanning sequence, and obtains a flooding sequence. The volume sequence defines the order in which the drop-pattern-generation device determines respective volumes for cells. The flow then moves to block B1015, where the drop-pattern-generation device initializes a volume index x to one (x=1), a scanning-sequence index y to one (y=1), a flooding-sequence index z to one (z=1), and a drop count n to one (n=1).

Next, in block B1020, the drop-pattern-generation device partitions the field material map into N cells (where N is a positive integer). Block B1020 includes blocks B1025-B1035, in which the drop-pattern-generation device determines the cell volumes of the cells according to the volume sequence. In block B1025, the drop-pattern-generation device determines a cell volume $v_{vx}$ for cell $c_{vx}$ (the cell at index x in the volume sequence v).

Figure 11:
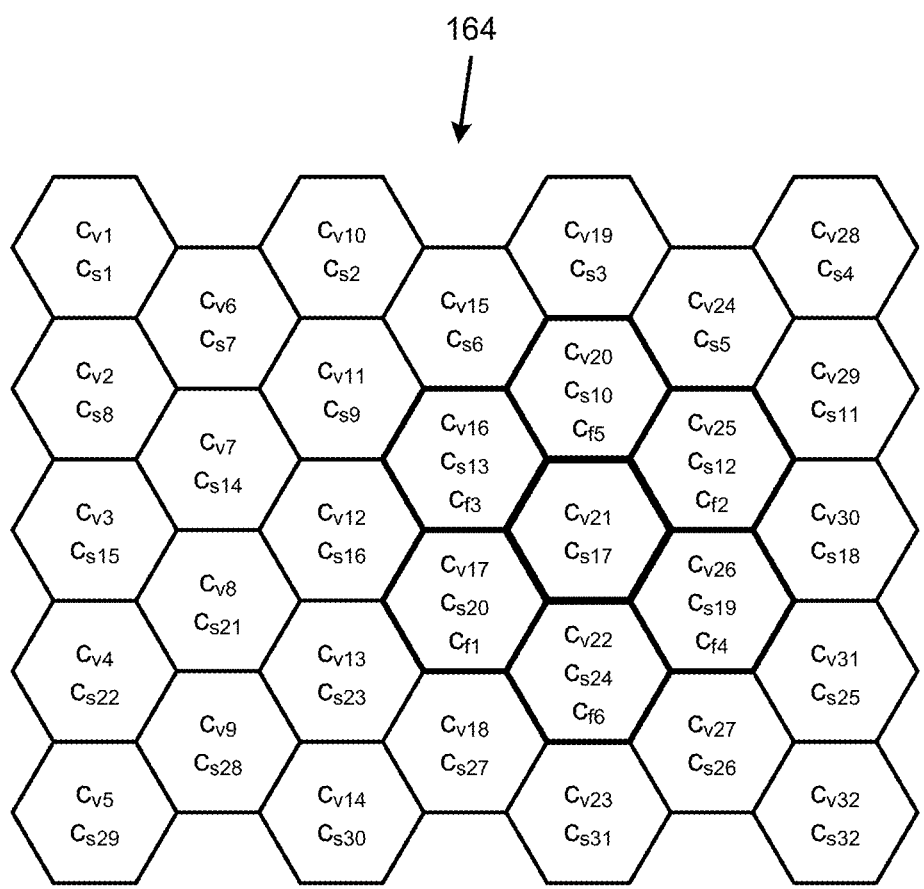
FIG. 11 illustrates example embodiments of volume indexes, scanning-sequence indexes, and flooding-sequence indexes.

Note that, although the volume index and the scanning sequence index both identify cells of the N cells (and thus each volume index has a corresponding scanning-sequence index that refers to the same cell), the volume sequence may progress though the cells in a different sequence (e.g., order, path) than the scanning sequence, for example as shown in FIG. 11, which illustrates example embodiments of volume indexes, scanning-sequence indexes, and flooding-sequence indexes. In FIG. 11, the volume sequence progresses through the cells in a set of cells 164 in a different order than the scanning sequence. Some cells (e.g., cell $c_{v1}/c_{s1}$, cell $c_{v32}/c_{s32}$) have the same volume index and scanning-sequence index. However, some cells have a volume index that is different from the cell's scanning-sequence index.

Thus, when the volume index x is identical to the scanning-sequence index y, cell $c_{vx}$ may not be the same cell as $c_{sy}$. Also, because cell $c_{vx}$ may not be the same cell as $c_{sy}$ when the volume index x is identical to the scanning-sequence index y, to distinguish between the volumes of cells that are referred to according to the volume index x and according to the scanning-sequence index y, the volumes of cells that are referred to according to the volume index x are denoted by $v_{vx}$, and the volumes of cells that are referred to according to the scanning-sequence index y are denoted by $v_{sy}$. But, when cell $c_{vx}$ is the same cell as cell $c_{sy}$ for particular values of the volume index x and the scanning-sequence index y (even if the volume index x is not identical to the scanning-sequence index y), then cell volume $v_{vx}$ is the same as cell volume $v_{sy}$. For example, in FIG. 11, cell volume $v_{s12}$ of cell $c_{v12}$ is the same as cell volume $v_{s16}$ of cell $c_{s16}$.

Also, the flooding sequence progresses though the cells in a different order then the scanning sequence and the volume sequence. Additionally, the flooding sequence is based on (e.g., uses as a point of reference) a selected cell (see, e.g., FIGS. 9A-D), and thus the flooding sequence progresses though the cells in different orders when based on different selected cells. Furthermore, depending on the selected cell that is the basis of the flooding sequence, each cell can be referred to by multiple indexes in the flooding sequence.

For example, in FIG. 11, when cell $c_{v21}/c_{s17}$ (which is the $21^{st}$ cell in the volume sequence and the 17th cell in the scanning sequence) is the selected cell (e.g., source cell), then cell $c_{v22}/c_{s24}$ is also cell $c_{f6}$ in the flooding sequence. However, if a different cell was the selected cell, then cell $c_{v22}/c_{s24}$ may have a different index in the flooding sequence.

Accordingly, to distinguish between the volumes of cells that are referred to according to the flooding-sequence index z, the volume index x, and the scanning-sequence index y, the volumes of cells that are referred to according to the flooding-sequence index z are denoted by $v_{fz}$. For example, the volume of cell $c_{v22}/c_{s24}/c_{f6}$ in FIG. 11 may be referred to by any of the following: $v_{v22}$, $v_{s24}$, and $v_{f6}$.

Then, in block B1030, the drop-pattern-generation device determines if there is a cell that does not have a determined cell volume (e.g., if x<N). If there is a cell that does not have a determined cell volume (B1030=Yes), then the flow proceeds to block B1035. In block B1035, the drop-pattern-generation device increases the volume index x by one, and then the flow returns to block B1025. If there is not a cell that does not have a determined volume (B1030=No), then the flow proceeds to block B1040.

In block B1040, the drop-pattern-generation device selects cell $c_{sy}$ (the cell at index y in the scanning sequence s) in the scanning sequence. Accordingly, cell $c_{sy}$ may be referred to as a source cell.

Then, in block B1045, the drop-pattern-generation device assigns at least some of the drop volume $D_n$ of drop $d_n$ to cell $c_{sy}$. In block B1045, the drop-pattern-generation device marks cell $c_{sy}$ as assigned; adds cell $c_{sy}$ to fill set $l_n$, which is a list of the cells that have been assigned part of the drop volume $D_n$ of drop $d_n$; and calculates the remaining drop volume $D_{n-rem}$ of drop $d_n$. In block B1045, the drop volume $D_n$ of drop $d_n$ is equal to the drop volume D that was obtained in block B1010. And, if the drop volume $D_n$ of drop $d_n$ is equal to or greater than the cell volume $v_{sy}$ of cell $c_{sy}$, then the drop-pattern-generation device assigns an amount of the drop volume $D_n$ that is equal to the cell volume $v_{sy}$ to cell $c_{sy}$. If the drop volume $D_n$ of drop $d_n$ is less than the cell volume $v_{sy}$ of cell $c_{sy}$, then the drop-pattern-generation device assigns all of the drop volume $D_n$ to cell $c_{sy}$.

Next, in block B1047, the drop-pattern-generation device adds the unassigned neighboring cells of cell $c_{sy}$ to a neighbor list according to the flooding sequence. Thus, the cells in the neighbor list are ordered in the same order in which they are visited by the flooding sequence. For example, if the flooding sequence is the flooding sequence in FIG. 9A, if cell $c_{s17}$ in FIG. 11 is the selected cell $c_{sy}$, and if cells $c_{s12}$, $c_{s10}$, $c_{s13}$, $c_{s20}$, $c_{s24}$ and $c_{s19}$ are all unassigned, then cells $c_{s12}$, $c_{s10}$, $c_{s13}$, $c_{s20}$, $c_{s24}$, and $c_{s19}$ would be added to the neighbor list in that order. Also for example, if cell $c_{s10}$ was assigned but the other five cells were unassigned, then cells $c_{s12}$, $c_{s13}$, $c_{s20}$, $c_{s24}$, and $c_{s19}$ would be added to the neighbor list in that order.

The flow then proceeds to block B1050, where the drop-pattern-generation device assigns determines if the remaining drop volume $D_{n-rem}$ is greater than zero. If the remaining drop volume $D_{n-rem}$ is greater than zero (B1050=Yes), then the flow moves to block B1055. In block B1055, the drop-pattern-generation device selects neighboring cell $c_{fz}$ of cell $c_{sy}$. For example, using an example from the previous paragraph, if cells $c_{s12}$, $c_{s10}$, $c_{s13}$, $c_{s20}$, $c_{s24}$, and $c_{s19}$ had been added to the neighbor list in that order and were the first cells in the neighbor list, then cell $c_{s12}$ would be cell $c_{f1}$ in the neighbor list.

Next, in block B1060, the drop-pattern-generation device assigns at least some of the remaining drop volume $D_{n-rem}$ of drop $d_n$ to neighboring cell $c_{fz}$. In block B1060, the drop-pattern-generation device marks neighboring cell $c_{fz}$ as assigned, adds cell $c_{fz}$ to fill set $l_n$, and calculates the remaining drop volume $D_{n-rem}$ of drop $d_n$. If the remaining drop volume $D_{n-rem}$ of drop $d_n$ is equal to or greater than the cell volume $v_{fz}$ of neighboring cell $c_{fz}$, then the drop-pattern-generation device assigns an amount of the remaining drop volume $D_{n-rem}$ that is equal to the cell volume $v_{fz}$ to neighboring cell $c_{fz}$. If the remaining drop volume $D_{n-rem}$ is less than the cell volume $v_{fz}$ of neighboring cell $c_{fz}$, then the drop-pattern-generation device assigns all of the remaining drop volume $D_{n-rem}$ to cell $c_{fz}$.

Then, in block B1065, the drop-pattern-generation device adds the unassigned neighboring cells of cell $c_{fz}$ to the neighbor list according to the flooding sequence. In block B1065, the unassigned neighboring cells of cell $c_{fz}$ may be added to the end of the neighbor list. The neighbors of cell $c_{fz}$ may be added to the neighbor list in an order determined by a flooding sequence that is based on the source cell S instead of being based on cell $c_{fz}$. Also, the flooding sequence may not be identical (in a relative sense) for each cell. Thus, in some embodiments, the drop-pattern-generation device obtains two or more flooding sequences and information that indicates which flooding sequence is used for each cell. In some such embodiments, neighboring cells of a neighboring cell are added to the neighbor list in an order determined by the flooding sequence of the source cell S. Alternatively, in some such embodiments, neighboring cells of a neighboring cell are added to the neighbor list in an order determined by the flooding sequence of the neighboring cell (e.g., the neighboring cells of cell $c_{fz}$ are added to the neighbor list in an order determined by the flooding sequence of cell $c_{fz}$). Furthermore, in some such embodiments, neighboring cells of a neighboring cell are added to the neighbor list in an order determined by the flooding sequences of both the source cell and the neighboring cell (e.g., the neighboring cells of cell $c_{fz}$ are added to the neighbor list in an order determined by the flooding sequences of cells S and $c_{fz}$).

The flow then moves to block B1070. In block B1070, the drop-pattern-generation device increases the flooding-sequence index z by one, and then the flow returns to block B1050.

If, in block B1050, the remaining drop volume $D_{n-rem}$ is not greater than zero (B1050=No), then the flow moves to block B1071. In block B1071, the drop-pattern-generation device increases the scanning index y by one. Next, in block B1073, the drop-pattern-generation device determines whether all of the cells have been scanned (e.g., if the scanning index y is greater than N). If the drop-pattern-generation device determines that all of the cells have not been scanned (B1073=No), then the flow moves to block B1075. In block B1075, the drop-pattern-generation device determines whether cell $c_{sy}$ is unassigned. If the drop-pattern-generation device determines that cell $c_{sy}$ is not unassigned (B1075=No), then the flow returns to block B1071. If the drop-pattern-generation device determines that cell $c_{sy}$ is unassigned (B1075=Yes), then the flow moves to block B1077, where the drop-pattern-generation device increases the drop count n by one, sets the flooding-sequence index z to one, and clears the neighbor list. The flow then returns to block B1040.

If in block B1073 the drop-pattern-generation device determines that all of the cells have been scanned (B1073=Yes), then the flow moves to block B1081. In block B1081, the drop-pattern-generation device sets a drop index i to one.

Figure 12:
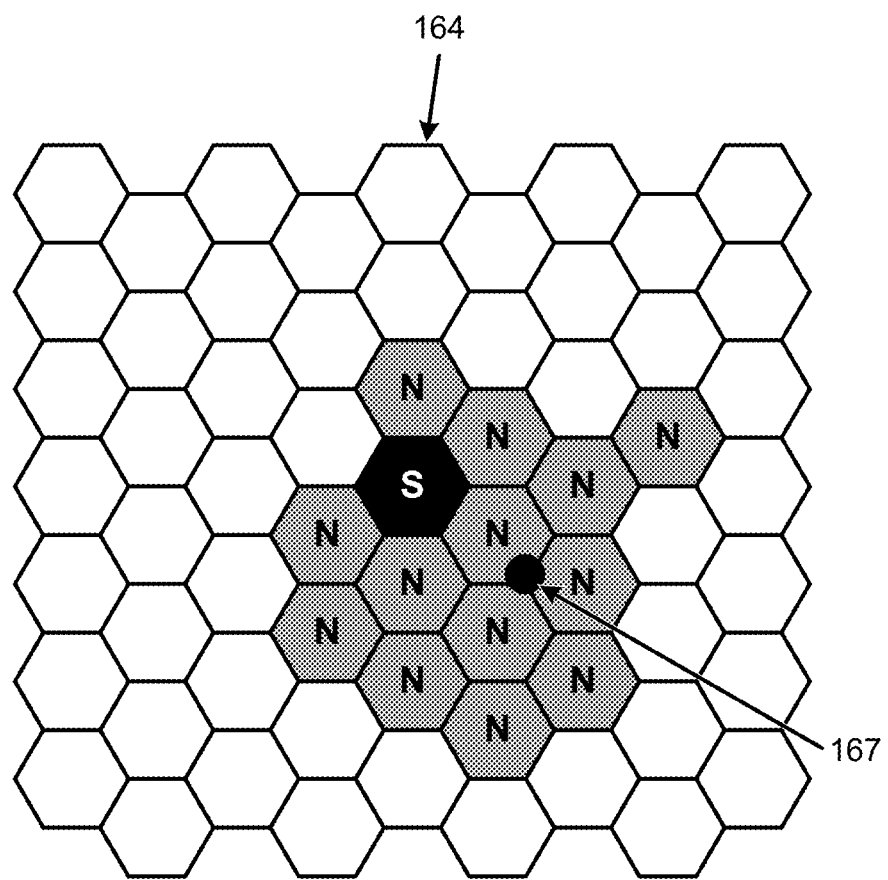
FIG. 12 illustrates an example embodiment of a source cell that is assigned to a fill set of a drop, neighboring cells that are assigned to the fill set, and a location of the drop.

Next, in block B1083, the drop-pattern-generation device selects the location of drop $d_i$ in the cells that are in fill set $l_i$, which define a drop region for drop $d_i$. For example, some embodiments of the drop-pattern-generation device compute the weighted mean of the cells in fill set $l_i$ by multiplying the horizontal and vertical coordinates of every cell by its assigned fluid volume, summing the results of the multiplication, then dividing the sum of the results by the sum of the assigned fluid volumes of all of the cells. Then these embodiments of the drop-pattern-generation device move the location of drop $d_i$ to the weighted mean of the cells. For example, FIG. 12 illustrates an example embodiment of a source cell that is assigned to a drop's fill set, neighboring cells that are assigned to the fill set, and a location of the drop (drop location). The fill set includes a source cell (S) and thirteen neighboring cells (N). The drop location 167 was calculated based on the weighted mean of the fourteen cells in the fill set.

Next, in block B1085, the drop-pattern-generation device increases the drop index i by one. Then, in block B1087, the drop-pattern-generation device determines if the drop index i is greater than the drop count n. If the drop-pattern-generation device determines that the drop index i is not greater than the drop count n (B1087=No), then the flow returns to block B1083. If the drop-pattern-generation device determines that the drop index i is greater than the drop count n (B1087=Yes), then the flow advances to block B1090. In block B1090, the drop-pattern-generation device outputs or stores the drop locations, which define a drop pattern. The flow then ends in block B1095.

Figure 13:
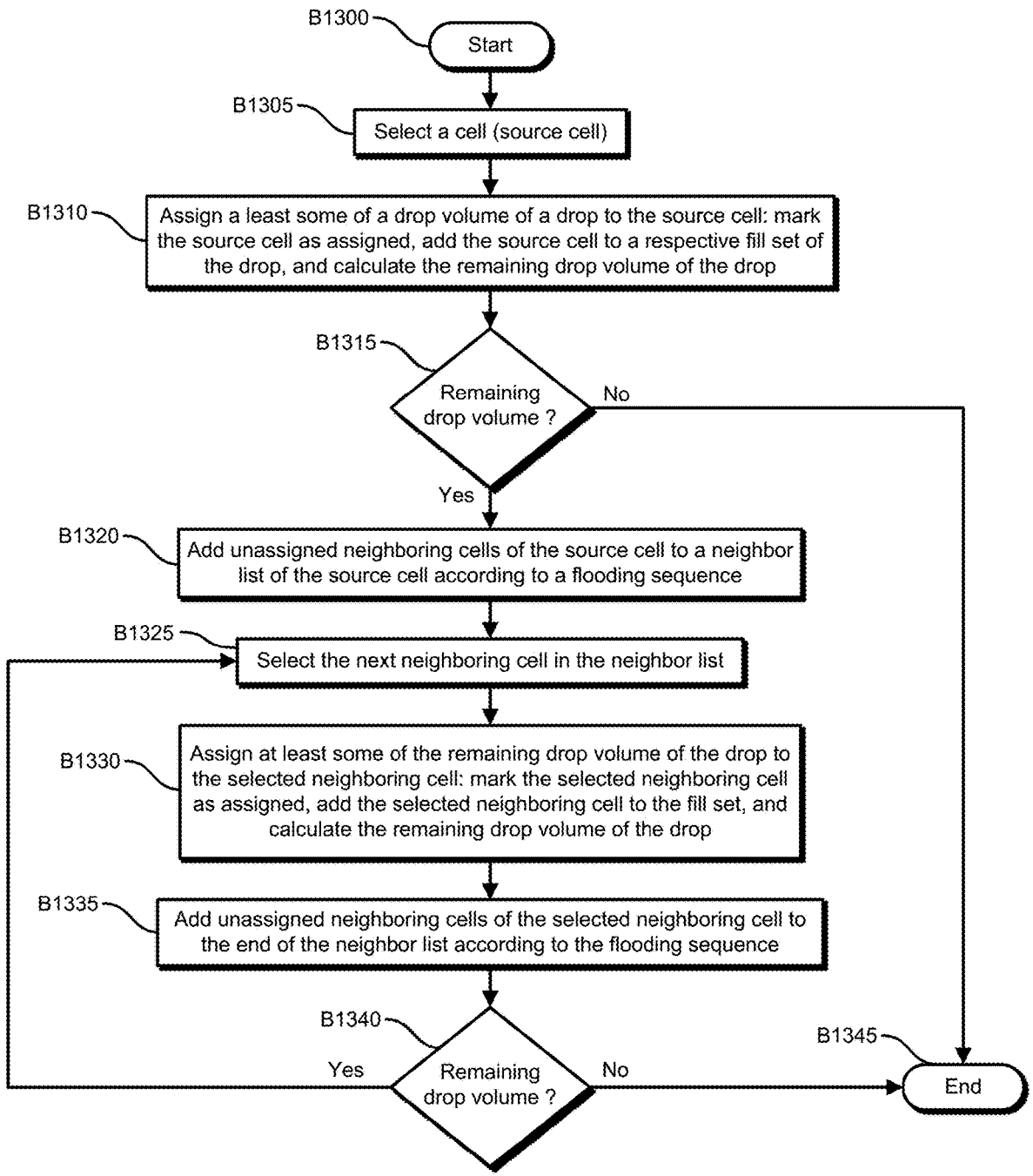
FIG. 13 illustrates an example embodiment of an operational flow for assigning a drop's drop volume to one or more cells.

FIG. 13 illustrates an example embodiment of an operational flow for assigning a drop's drop volume to one or more cells. The flow starts in block B1300 and moves to block B1305, where a drop-pattern-generation device selects a source cell. Next, in block B1310, the drop-pattern-generation device assigns at least some of a drop volume of a drop to the source cell, which includes marking the source cell as assigned, adding the source cell to a respective fill set of the drop, and calculating the remaining drop volume of the drop.

The flow then proceeds to block B1315, where the drop-pattern-generation device determines if any drop volume remains. If the drop-pattern-generation device determines that no drop volume remains (B1315=No), then the flow moves to block B1345, where the flow ends. If the drop-pattern-generation device determines that drop volume remains (B1315=Yes), then the flow proceeds to block B1320.

Figure 14A:
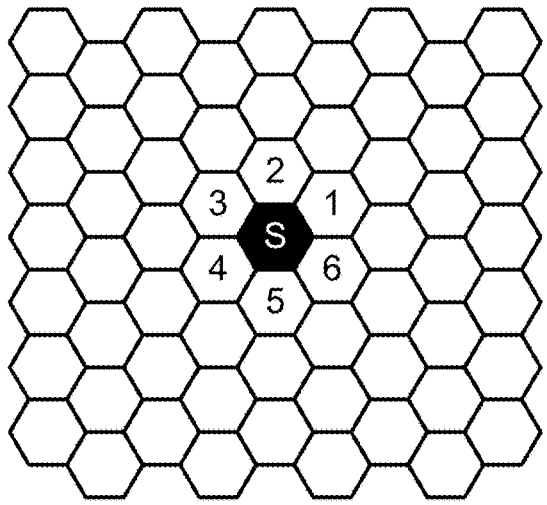
FIG. 14A illustrates an example embodiment of a source cell and neighboring cells that have been added to a neighbor list.

In block B1320, the drop-pattern-generation device adds one or more unassigned neighboring cells of the source cell to a neighbor list of the source cell according to a flooding sequence. The flooding sequence identifies neighboring cells to add to the neighbor list and the positions of the neighboring cells in the neighbor list. For example, FIG. 14A illustrates an example embodiment of a source cell and neighboring cells that have been added to a neighbor list. In this embodiment, the six abutting neighboring cells of the source cell S are included in the neighbor list. Also, the neighboring cells were added to the neighbor list according to the flooding sequence in FIG. 9A, and the neighboring cells that are in the neighbor list are numbered 1-6 to indicate the order of the neighboring cells in the neighbor list. In this example, the order of the neighboring cells in the neighbor list is the same as the flooding sequence for these six cells because all of these cells are included in the flooding sequence and are unassigned.

Then, in block B1325, the drop-pattern-generation device selects the next neighboring cell in the neighbor list. In the first iteration of block B1325, the next neighboring cell from the neighbor list will be the first neighboring cell in the neighbor list. For example, if the source cell is the source cell S from FIG. 14A, then neighboring cell 1 would be the neighboring cell that is selected in the first iteration of block B1325.

The flow then moves to block B1330, where the drop-pattern-generation device assigns at least some of the remaining drop volume of the drop to the selected neighboring cell, which includes marking the selected neighboring cell as assigned, adding the selected neighboring cell to the fill set, and calculating the remaining drop volume of the drop.

Figure 14B:
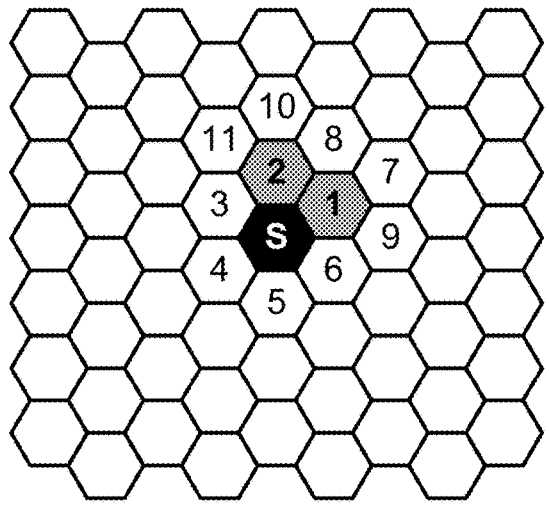
FIG. 14B illustrates an example embodiment of a source cell, neighboring cells that have been assigned part of a drop volume, and neighboring cells that have been added to a neighbor list.
Figure 14C:
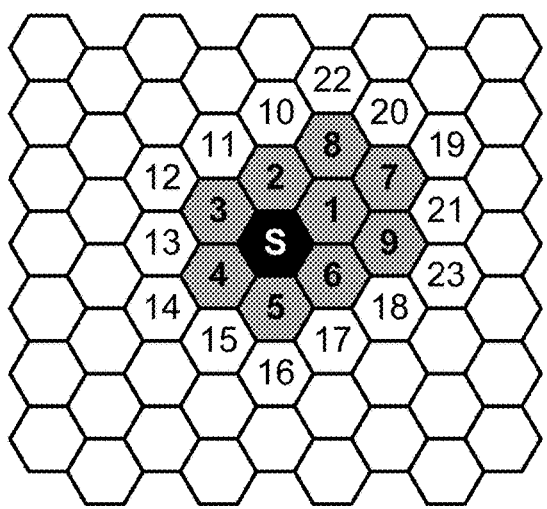
FIG. 14C illustrates an example embodiment of a source cell, neighboring cells that have been assigned part of a drop volume, and neighboring cells that have been added to a neighbor list.

Then, in block B1335, the drop-pattern-generation device adds the unassigned neighboring cells of the selected neighboring cell that are not in the neighbor list to end of the neighbor list according to the flooding sequence. For example, FIG. 14B illustrates an example embodiment of a source cell, neighboring cells that have been assigned part of a drop volume, and neighboring cells that have been added to a neighbor list. In FIG. 14B, the first two neighboring cells of the source cell S in FIG. 14A have been assigned part of the drop volume, and neighboring cells that have been assigned part of the drop volume are indicated by shading. Also, the unassigned neighboring cells of neighboring cells 1 and 2 have been added to the neighbor list according to the flooding sequence. For example, cells 7, 8, and 9, which are unassigned neighbors of cell 1 and were not included in the neighbor list, were added to the end of the neighbor list according to the flooding sequence (which is the same as the flooding sequence in FIG. 9A). Note that the flooding sequence skipped over (A) the assigned cell (the source cell S) and (B) the neighboring cells (cells 2 and 6) of cell 1 that were already included in the neighbor list. Also, because cell 1 preceded cell 2 in the neighbor list, cells 7-9 were added to the neighbor list before cells 10-11 were added to the neighbor list. Also for example, FIG. 14C illustrates an example embodiment of a source cell, neighboring cells that have been assigned part of a drop volume, and neighboring cells that have been added to a neighbor list. In FIG. 14C, the first nine neighboring cells from the neighbor list in FIG. 14B have been assigned part of the drop volume. Also, the unassigned neighboring cells of neighboring cells 1-9 have been added to the end of the neighbor list according to the flooding sequence.

Next, in block B1340, the drop-pattern-generation device determines if any drop volume remains. If the drop-pattern-generation device determines that no drop volume remains (B1340=No), then the flow moves to block B1345, where the flow ends. If the drop-pattern-generation device determines that some drop volume remains (B1340=Yes), then the flow returns to block B1325.

Thus, as shown by FIG. 13, some embodiments of the drop-pattern-generation device recursively distribute a drop volume among cells.

Figure 15A:
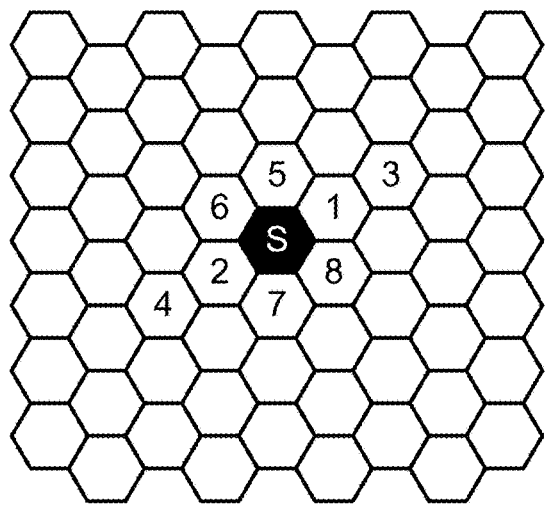
FIG. 15A illustrates an example embodiment of a source cell and neighboring cells that have been added to a neighbor list according to a flooding sequence.

FIG. 15A illustrates an example embodiment of a source cell and neighboring cells that have been added to a neighbor list according to a flooding sequence. In this embodiment, the six abutting neighboring cells of the source cell S are included in the neighbor list, as well as two other neighboring cells. Also, the neighboring cells were added to the neighbor list according to the flooding sequence in FIG. 9B. Additionally, the neighboring cells in the neighbor list are numbered to indicate the order in which the neighboring cells are arranged in the neighbor list—the position of each neighboring cell in the neighbor list is indicated by the neighboring cell's respective number (1-8). In this example, the order in which the neighboring cells are arranged in the neighbor list is the same as the flooding sequence for these eight cells because all of these cells are included in the flooding sequence and are unassigned.

Figure 15B:
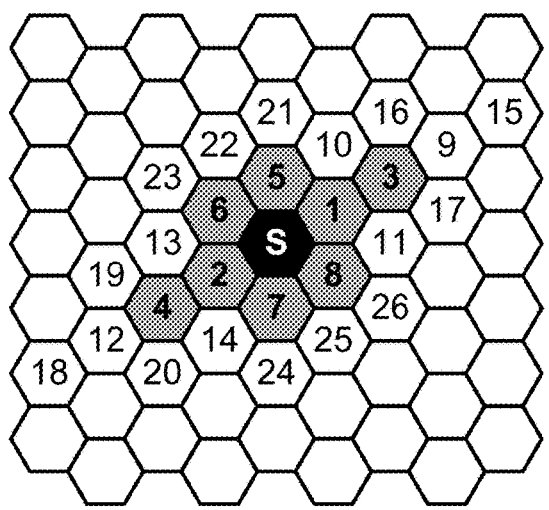
FIG. 15B illustrates an example embodiment of a source cell, neighboring cells that have been assigned part of a drop volume, and neighboring cells that have been added to a neighbor list according to a flooding sequence.

FIG. 15B illustrates an example embodiment of a source cell, neighboring cells that have been assigned part of a drop volume, and neighboring cells that have been added to a neighbor list according to a flooding sequence. FIG. 15B shows the cells from FIG. 15A after part of a drop volume was assigned to each of the first eight neighboring cells and unassigned neighboring cells of a neighboring cell were added to the end of the neighbor list with the assignment of part of the drop volume to the neighboring cell (e.g., as described in blocks B1060-61065 in FIG. 10, as described in blocks B1330-61335 in FIG. 13). The neighboring cells that have been assigned part of a drop volume (cells 1-8) are further indicated by shading.

Figure 15C:
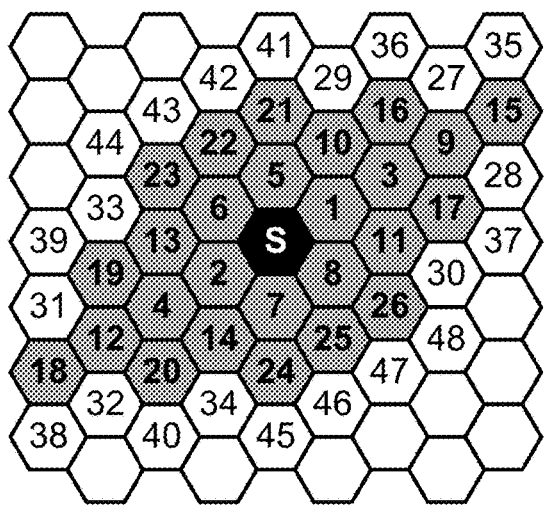
FIG. 15C illustrates an example embodiment of a source cell, neighboring cells that have been assigned part of a drop volume, and neighboring cells that have been added to a neighbor list according to a flooding sequence.

FIG. 15C illustrates an example embodiment of a source cell, neighboring cells that have been assigned part of a drop volume, and neighboring cells that have been added to a neighbor list according to a flooding sequence. FIG. 15C shows the cells from FIG. 15B after part of a drop volume was also assigned to each of the unassigned eighteen neighboring cells (cells 9-26) and unassigned neighboring cells of a neighboring cell were added to the end of the neighbor list with the assignment of part of the drop volume to the neighboring cell (e.g., as described in blocks B1060-61065 in FIG. 10, as described in blocks B1330-61335 in FIG. 13). The neighboring cells that have been assigned part of a drop volume (cells 1-26) are further indicated by shading.

As shown by FIGS. 15A-C, the flooding sequence can be used to control or configure (e.g., adjust) the distribution of a drop volume.

Figure 16A:
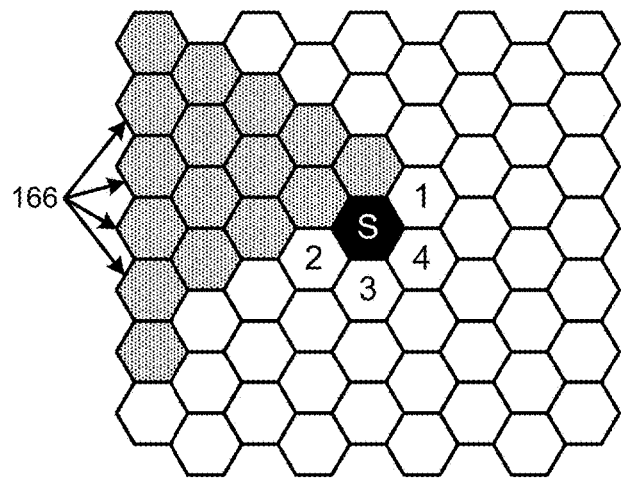
FIG. 16A illustrates an example embodiment of a source cell, neighboring cells that have been added to a neighbor list according to a flooding sequence, and previously assigned cells.

FIG. 16A illustrates an example embodiment of a source cell, neighboring cells that have been added to a neighbor list according to a flooding sequence, and previously assigned cells. The previously assigned cells 166 have already been assigned part of a drop volume. In this embodiment, the four abutting unassigned neighboring cells of the source cell S are included in the neighbor list. Also, the neighboring cells were added to the neighbor list according to the flooding sequence in FIG. 9C. Additionally, the neighboring cells in the neighbor list are numbered to indicate the order in which the neighboring cells are arranged in the neighbor list—the position of each neighboring cell in the neighbor list is indicated by the neighboring cell's respective number (1-4). In this example, each neighboring cell's number in the neighbor list is different than the neighboring cell's number in the flooding sequence because two of the neighboring cells in the flooding sequence are previously assigned cells 166.

Figure 16B:
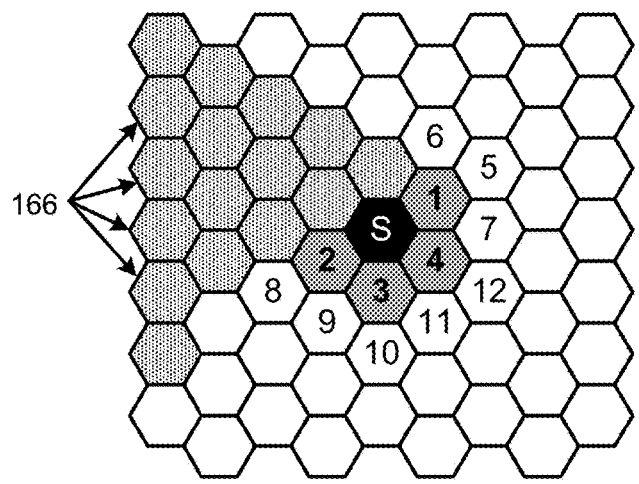
FIG. 16B illustrates an example embodiment of a source cell, neighboring cells that have been assigned part of a drop volume, neighboring cells that have been added to a neighbor list according to a flooding sequence, and previously assigned cells.

FIG. 16B illustrates an example embodiment of a source cell, neighboring cells that have been assigned part of a drop volume, and neighboring cells that have been added to a neighbor list according to a flooding sequence. FIG. 16B shows the cells from FIG. 16A after part of a drop volume was assigned to each of the first four neighboring cells (cells 1-4) and unassigned neighboring cells of a neighboring cell were added to the end of the neighbor list with the assignment of part of the drop volume to the neighboring cell (e.g., as described in blocks B1060-61065 in FIG. 10, as described in blocks B1330-61335 in FIG. 13). The neighboring cells that have been assigned part of a drop volume (cells 1-4) are further indicated by shading.

Figure 16C:
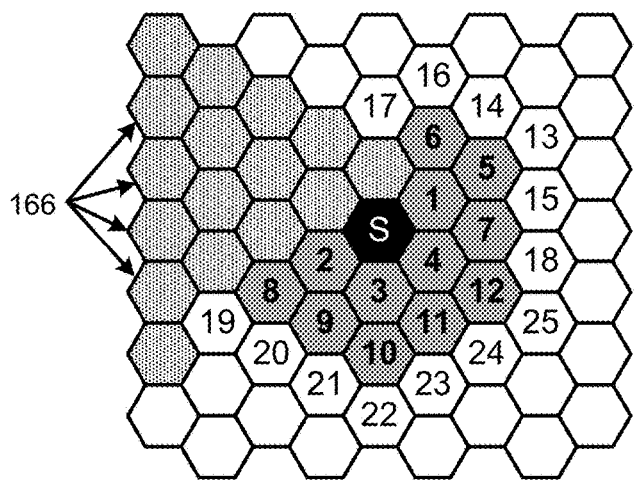
FIG. 16C illustrates an example embodiment of a source cell, neighboring cells that have been assigned part of a drop volume, neighboring cells that have been added to a neighbor list according to a flooding sequence, and previously assigned cells.

FIG. 16C illustrates an example embodiment of a source cell, neighboring cells that have been assigned part of a drop volume, and neighboring cells that have been added to a neighbor list according to a flooding sequence. FIG. 16C shows the cells from FIG. 16B after part of a drop volume was also assigned to each of the unassigned eight neighboring cells (cells 5-12) and unassigned neighboring cells of a neighboring cell were added to the end of the neighbor list with the assignment of part of the drop volume to the neighboring cell (e.g., as described in blocks B1060-61065 in FIG. 10, as described in blocks B1330-61335 in FIG. 13). The neighboring cells that have been assigned part of a drop volume (cells 1-12) are further indicated by shading.

Figure 17:
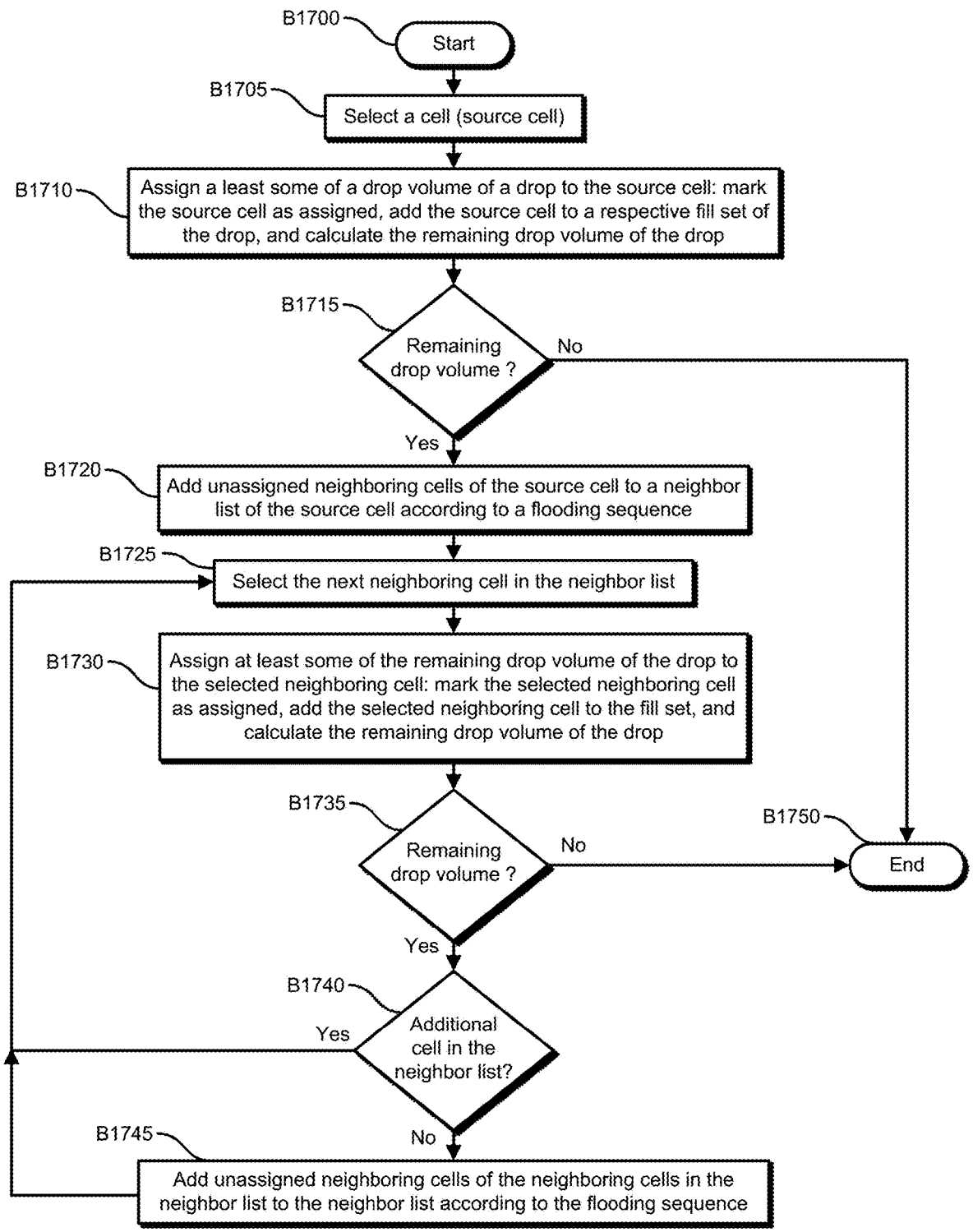
FIG. 17 illustrates an example embodiment of an operational flow for assigning a drop's drop volume to one or more cells.

FIG. 17 illustrates an example embodiment of an operational flow for assigning a drop's drop volume to one or more cells. The flow starts in block B1700 and moves to block B1705, where a drop-pattern-generation device selects a source cell. Next, in block B1710, the drop-pattern-generation device assigns at least some of a drop volume of a drop to the source cell, which includes marking the source cell as assigned, adding the source cell to a respective fill set of the drop, and calculating the remaining drop volume of the drop.

The flow then proceeds to block B1715, where the drop-pattern-generation device determines if any drop volume remains. If the drop-pattern-generation device determines that no drop volume remains (B1715=No), then the flow moves to block B1750, where the flow ends. If the drop-pattern-generation device determines that some drop volume remains (B1715=Yes), then the flow moves to block B1720.

Figure 18A:
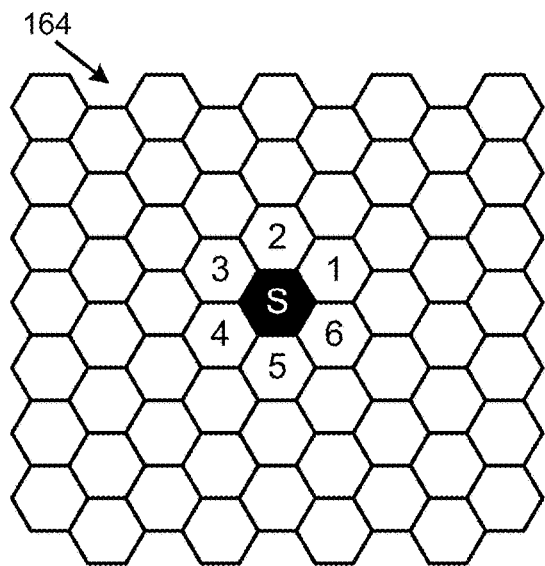
FIG. 18A illustrates an example embodiment of a source cell and neighboring cells that have been added to a neighbor list.

In block B1720, the drop-pattern-generation device adds one or more unassigned neighboring cells of the source cell to a neighbor list of the source cell according to a flooding sequence. The flooding sequence identifies neighboring cells to add to the neighbor list and the positions of the neighboring cells in the neighbor list. For example, FIG. 18A illustrates an example embodiment of a source cell and neighboring cells that have been added to a neighbor list. In this embodiment, the six abutting neighboring cells of the source cell S are included in the neighbor list. Also, the neighboring cells were added to the neighbor list according to the flooding sequence in FIG. 9A. Additionally, the neighboring cells in the neighbor list are numbered 1-6 to indicate their order in the neighbor list. In this example, the order of the neighboring cells in the neighbor list is the same as the flooding sequence for these six cells because all of these cells are included in the flooding sequence and are unassigned.

Then, in block B1725, the drop-pattern-generation device selects the next neighboring cell in the neighbor list. The first time the flow visits block B1725, the next neighboring cell from the neighbor list will be the first neighboring cell in the neighbor list. For example, if the source cell is the source cell S from FIG. 18A, then neighboring cell 1 would be the neighboring cell that is selected the first time the flow visits block B1725.

The flow then moves to block B1730, where the drop-pattern-generation device assigns at least some of the remaining drop volume of the drop to the selected neighboring cell, which includes marking the selected neighboring cell as assigned, adding the selected neighboring cell to the fill set, and calculating the remaining drop volume of the drop.

Next, in block B1735, the drop-pattern-generation device determines if any drop volume remains. If the drop-pattern-generation device determines that no drop volume remains (B1735=No), then the flow moves to block B1750, where the flow ends. If the drop-pattern-generation device determines that some drop volume remains (B1735=Yes), then the flow moves to block B1740.

In block B1740, the drop-pattern-generation device determines if the neighbor list includes at least one additional neighboring cell, which would be an unassigned neighboring cell. If the drop-pattern-generation device determines that the neighbor list includes at least one additional neighboring cell (B1740=Yes), then the flow returns to block B1725. If the drop-pattern-generation device determines that the neighbor list does not include at least one additional neighboring cell (B1740=No), then the flow moves to block B1745.

Figure 18B:
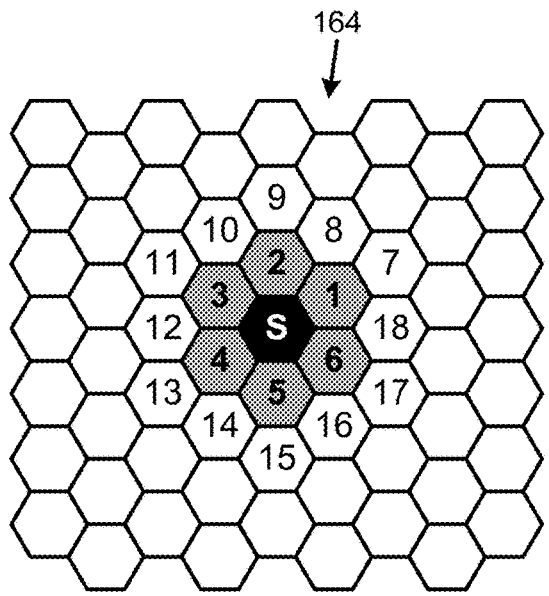
FIG. 18B illustrates an example embodiment of a source cell, neighboring cells that have been assigned part of a drop volume, and neighboring cells that have been added to a neighbor list.
Figure 19A:
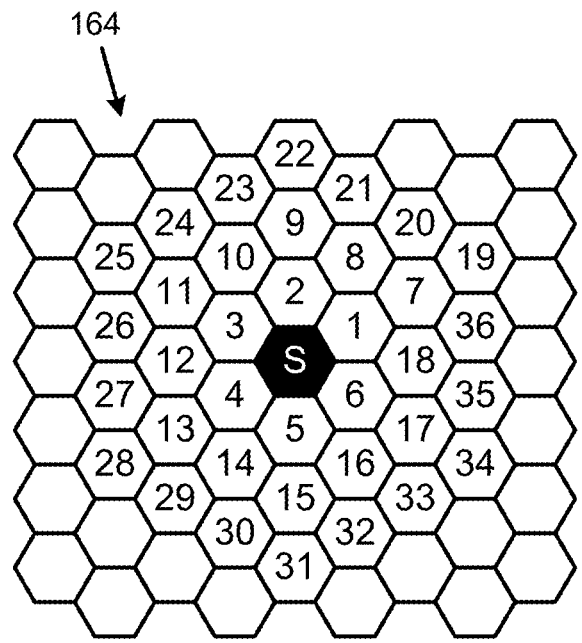
FIGS. 19A-B illustrate example embodiments of flooding sequences.
Figure 19B:
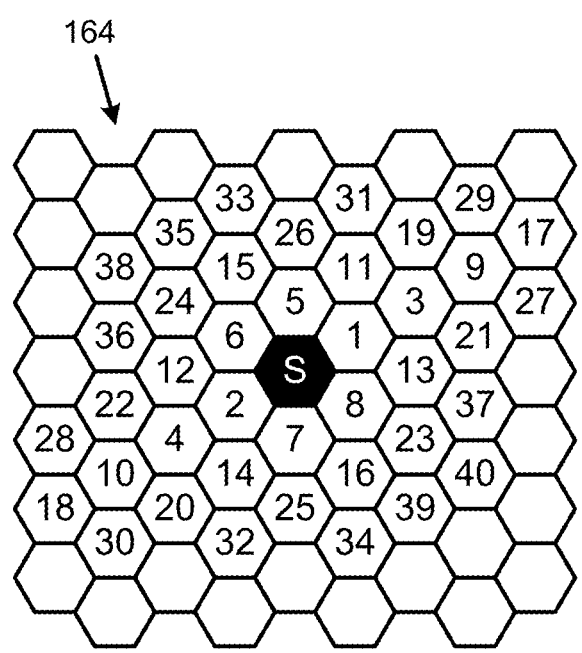

In block B1745, the drop-pattern-generation device adds the unassigned neighboring cells of the neighboring cells that are in the neighbor list to the neighbor list. For example, FIG. 18B illustrates an example embodiment of a source cell, neighboring cells that have been assigned part of a drop volume, and neighboring cells that have been added to a neighbor list. FIG. 18B shows the cells in FIG. 18A after the six neighboring cells (cells 1-6) of the source cell S were assigned part of the drop volume. The neighboring cells that have been assigned some of the drop volume are indicated by the shading. After the drop-pattern-generation device determined that some of the drop volume remained (e.g., in block B1735) and that all of the neighboring cells 1-6 in the neighbor list had been assigned some of the drop volume (e.g., no additional unassigned neighboring cells remained in the neighbor list in block B1740), then the drop-pattern-generation device added the unassigned neighboring cells of the first six neighboring cells 1-6 to the neighbor list. The unassigned neighboring cells that were added to the neighbor list are indicated by their respective position (7-18) in the neighbor list. In this example embodiment, the flooding sequence includes the cells that abut the source cell as well as cells that do not abut the source cell. Also, when adding unassigned neighboring cells to the neighbor list, the drop-pattern-generation device may progress through the neighbor list in order, adding the unassigned neighboring cells of the neighboring cells in the neighbor list according to the flooding sequence. Furthermore, the flooding sequence may be so large that it includes enough cells to assign all of a drop volume. For example, FIGS. 19A-B illustrate example embodiments of flooding sequences, and these flooding sequences include more cells than the flooding sequences in FIGS. 9A-D. In some embodiments, the size of the flooding sequence may be configured based on various parameters, including drop volume, cell size, and the pattern of flooding propagation. Additionally, in some embodiments, the flooding sequence is divided into multiple subsequences, and, in block B1720 and in each iteration of block B1745, the next subsequence is added to the neighbor list. For example, the flooding sequence in FIG. 19B may be divided into four subsequences, each of which includes ten cells. In block B1720, the ten neighboring cells of the first subsequence may be added to the neighbor list, and, each time the flow visits block B1745, the ten neighboring cells in the next subsequence may be added to the neighbor list.

Figure 18C:
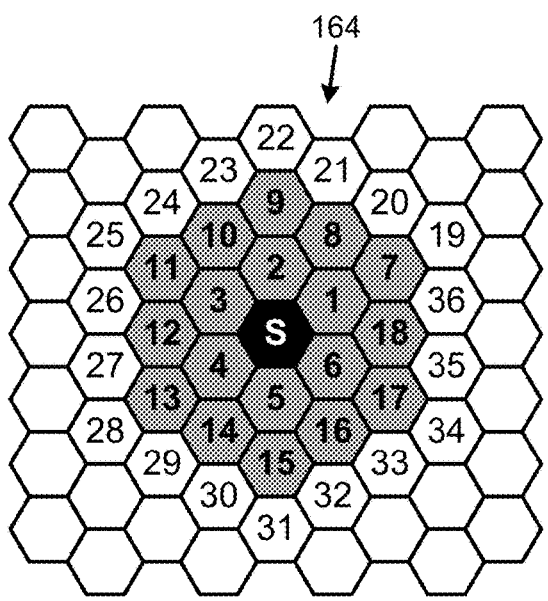
FIG. 18C illustrates an example embodiment of a source cell, neighboring cells that have been assigned part of a drop volume, and neighboring cells that have been added to a neighbor list.

Additionally, FIG. 18C illustrates an example embodiment of a source cell, neighboring cells that have been assigned part of a drop volume, and neighboring cells that have been added to a neighbor list. FIG. 18C shows the cells in FIG. 18B after the twelve unassigned neighboring cells (cells 7-18) were assigned part of the drop volume. Again, the neighboring cells that have been assigned some of the drop volume are indicated by shading. After the drop-pattern-generation device determined that some of the drop volume remained (e.g., in block B1735) and that all of the neighboring cells in the neighbor list had been assigned some of the drop volume (e.g., no additional neighboring cells remained in the neighbor list in block B1740), then the drop-pattern-generation device added the unassigned neighboring cells of the neighboring cells in the neighbor list to the neighbor list according to the flooding sequence. The unassigned neighboring cells in the neighbor list are indicated by their respective positions in the neighbor list (19-36).

After block B1745, the flow returns to block B1725.

Figure 20:
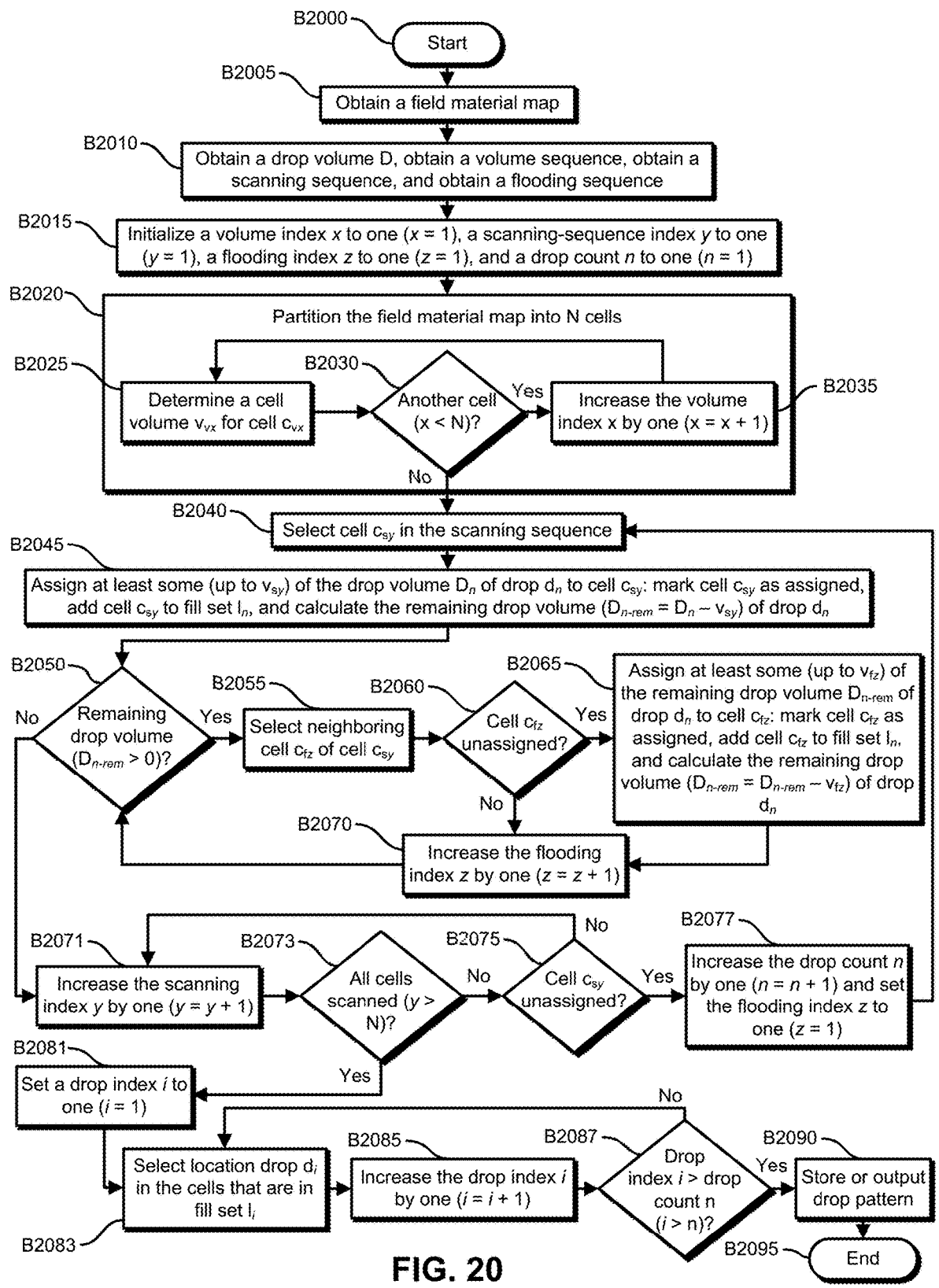
FIG. 20 illustrates an example embodiment of an operational flow for generating a drop pattern.

FIG. 20 illustrates an example embodiment of an operational flow for generating a drop pattern. The flow starts in block B2000 and then moves to block B2005, where a drop-pattern-generation device obtains a field material map. Next, in block B2010, the drop-pattern-generation device obtains a drop volume D, obtains a volume sequence, obtains a scanning sequence, and obtains a flooding sequence. The flow then moves to block B2015, where the drop-pattern-generation device initializes a volume index x to one (x=1), a scanning-sequence index y to one (y=1), a flooding-sequence index z to one (z=1), and a drop count n to one (n=1).

Next, in block B2020, the drop-pattern-generation device partitions the field material map into N cells (where N is a positive integer). Block B2020 includes blocks B2025-B2035, in which the drop-pattern-generation device determines the cell volumes according to the volume sequence. In block B2025, the drop-pattern-generation device determines a cell volume $v_{vx}$ for cell $c_{vx}$ (the cell at index x in the volume sequence v). Then, in block B2030, the drop-pattern-generation device determines if there is a cell that does not have a determined cell volume (e.g., determines if x<N). If there is a cell that does not have a determined volume (B2030=Yes), then the flow proceeds to block B2035. In block B2035, the drop-pattern-generation device increases the volume index x by one, and then the flow returns to block B2025. If there is not a cell that does not have a determined volume (B2030=No), then the flow proceeds to block B2040.

In block B2040, the drop-pattern-generation device selects cell $c_{sy}$ (the cell at index y in the volume sequence s) in the scanning sequence. Thus, cell $c_{sy}$ may be referred to as a source cell.

Then, in block B2045, the drop-pattern-generation device assigns at least some of the drop volume $D_n$ of drop $d_n$ to cell $c_{sy}$. In block B2045, the drop-pattern-generation device marks cell $c_{sy}$ as assigned; adds cell $c_{sy}$ to fill set $l_n$, which is a list of the cells that have been assigned part of the drop volume $D_n$ of drop $d_n$; and calculates the remaining drop volume $D_{n-rem}$ of drop $d_n$. In block B2045, the drop volume $D_n$ of drop $d_n$ is equal to the drop volume D that was obtained in block B2010. And, if the drop volume $D_n$ of drop $d_n$ is equal to or greater than the cell volume $v_{sy}$ of cell $c_{sy}$, then the drop-pattern-generation device assigns an amount of the drop volume $D_n$ that is equal to the cell volume $v_{sy}$ to cell $c_{sy}$. If the drop volume $D_n$ of drop $d_n$ is less than the cell volume $v_{sy}$ of cell $c_{sy}$, then the drop-pattern-generation device assigns all of the drop volume $D_n$ to cell $c_{sy}$.

The flow then proceeds to block B2050, where the drop-pattern-generation device determines if the remaining drop volume $D_{n-rem}$ is greater than zero. If the remaining drop volume $D_{n-rem}$ is greater than zero (B2050=Yes), then the flow moves to block B2055.

In block B2055, the drop-pattern-generation device selects neighboring cell $c_{fz}$ of cell $c_{sy}$ according to a flooding sequence. The flooding sequence may define a flooding sequence in a group of cells that is guaranteed to exceed a drop volume based on the drop volume and on a minimum cell volume, which may allow the drop-pattern-generation device to select neighboring cells without adding neighboring cells to a neighbor list. For example, the flooding sequences in FIGS. 19A-B may include groups of cells that are guaranteed to exceed a drop volume.

Next, in block B2060, the drop-pattern-generation device determines whether neighboring cell $c_{fz}$ is unassigned. If the drop-pattern-generation device determines that neighboring cell $c_{fz}$ is unassigned (B2060=Yes), then the flow moves to block B2065. In block B2065, the drop-pattern-generation device assigns at least some of the remaining drop volume $D_{n\text{-}rem}$ of drop $d_n$ to neighboring cell $c_{fz}$. The drop-pattern-generation device marks neighboring cell $c_{fz}$ as assigned, adds cell $c_{fz}$ to fill set $l_n$, and calculates the remaining drop volume $D_{n\text{-}rem}$ of drop $d_n$. If the remaining drop volume $D_{n\text{-}rem}$ of drop $d_n$ is equal to or greater than the cell volume $v_{fz}$ of neighboring cell $c_{fz}$, then the drop-pattern-generation device assigns an amount of the remaining drop volume $D_{n\text{-}rem}$ that is equal to the cell volume $v_{fz}$ to neighboring cell $c_{fz}$. If the remaining drop volume $D_{n\text{-}rem}$ is less than the cell volume $v_{fz}$ of neighboring cell $c_{fz}$, then the drop-pattern-generation device assigns all of the remaining drop volume $D_{n\text{-}rem}$ to cell $c_{fz}$. The flow then moves to block B2070.

Also, if the drop-pattern-generation device determines that neighboring cell $c_{fz}$ is not unassigned (B2060=No), then the flow moves to block B2070.

In block B2070, the drop-pattern-generation device increases the flooding-sequence index z by one, and then the flow returns to block B2050.

If, in block B2050, the remaining drop volume $D_{n\text{-}rem}$ is not greater than zero (B2050=No), then the flow moves to block B2071. In block B2071, the drop-pattern-generation device increases the scanning index y by one. Next, in block B2073, the drop-pattern-generation device determines whether all of the cells have been scanned (e.g., determines if the scanning index y is greater than N). If the drop-pattern-generation device determines that all of the cells have not been scanned (B2073=No), then the flow moves to block B2075. In block B2075, the drop-pattern-generation device determines whether cell $c_{sy}$ is unassigned. If the drop-pattern-generation device determines that cell $c_{sy}$ is not unassigned (B2075=No), then the flow returns to block B2071. If the drop-pattern-generation device determines that cell $c_{sy}$ is unassigned (B2075=Yes), then the flow moves to block B2077, where the drop-pattern-generation device increases the drop count n by one and sets the flooding-sequence index z to one. The flow then returns to block B2040.

If in block B2073 the drop-pattern-generation device determines that all of the cells have been scanned (B2073=Yes), then the flow moves to block B2081. In block B2081, the drop-pattern-generation device sets a drop index i to one. Next, in block B2083, the drop-pattern-generation device selects the location of drop $d_i$ in the cells that are in fill set $l_i$.

Then, in block B2085, the drop-pattern-generation device increases the drop index i by one. The flow then moves to block B2087, where the drop-pattern-generation device determines if the drop index i is greater than the drop count n. If the drop-pattern-generation device determines that the drop index i is not greater than the drop count n (B2087=No), then the flow returns to block B2083. If the drop-pattern-generation device determines that the drop index i is greater than the drop count n (B2087=Yes), then the flow advances to block B2090. In block B2090, the drop-pattern-generation device outputs or stores a drop pattern, which includes the drop locations. The flow then ends in block B2095.

Thus, some embodiments of the operational flows that are described herein satisfy the following criteria: (1) The total volume of the drops matches the total volume of the features of the imprint field map in addition to any residual layer volume. For example, in some embodiments, the maximum volume mismatch, which is the difference between the volume of one drop and the aggregate volume of the cells that are assigned to that drop, is guaranteed to be less than the volume of one cell. (2) The drops are placed such that they minimize the nonuniformity of uniform imprint field regions, such as the residual layer (RL) or uniform density regions in the imprint field. For example, in some embodiments, in uniform density regions, all drops will have equally sized regions assigned to them, which in turn spaces the drops equally from each other, which results in a uniform drop density. (3) The drops are placed to adapt to the features of the imprint field such that areas of higher feature density have a higher drop density and areas of lower feature density have a lower drop density. For example, in some embodiments, in areas of varying drop density, the drop-region sizes (a drop-regions size is the sum of the sizes of the cells assigned to a respective drop) change according to the field-material map such that the drop-regions sizes grow in low density regions and the drop-regions sizes shrink in high density regions, which results in a drop density that adaptively matches the field's feature-density distribution.

Additionally some embodiments of the operational flows that are described herein generate a drop pattern for a small region of the field (e.g., a region that would be filled by a single drop). Once the optimal location for a drop is selected, the drop is fixed in that location for the remainder of the drop-pattern generation and all further drop-location optimizations are applied to the drops that do not yet have a selected location. In operation, this gradually reduces the imprint-field area and reduces the fluid-volume requirements by the amount supplied by drops that already have a selected location.

Furthermore, some embodiments of the operational flows that are described herein are deterministic in the sense that they output the same drop pattern every time the same field material map is input. Also, because these operational flows are non-iterative in the sense that assignment of a drop volume is performed only once for each cell, they guarantee that the optimal drop pattern is obtained and that the process does not get stuck in a local minimum and fail to converge. Thus, these operational flows can be performed quickly because they visit each cell only once in a scanning sequence. In contrast, iterative algorithms read the field material map several times (sometimes tens of millions of times) and update the drop locations in every iteration in an attempt to minimize an error metric. These iterative algorithms are very time consuming, especially when used for some regions larger than a single imprint field (e.g., a whole wafer).

Furthermore, sometimes cells that are assigned to drops have unclaimed cells in between that have low cell volumes. Placing a drop of the same drop volume in these interstitial regions could result in a high volume mismatch. In this case, if the fluid dispenser supports dispensing drops of different volumes, larger drops can be used for the earlier-assigned cells in the scanning sequence, and the drop volume can be decreased gradually for later-assigned cells in the scanning sequence in order to minimize the interstitial volume mismatch.

Also, the regions of the imprint field that are near the boundary can have suboptimal drop placements with a high volume mismatch because of the lack of cells to be claimed by the drops. Thus, some embodiments of the operational flows develop the drop pattern for an area that is slightly larger than the desired imprint field or wafer area so that all the suboptimally placed drops lie outside the imprint field or wafer area. After the process terminates, the drops lying outside the imprint field or wafer area can be discarded. Because the operational flows may have execution times that increase linearly with the number of cells, an increase in the imprint-field area may not significantly increase the execution time. An embodiment may include generating a large drop pattern for a larger area that is made up of sub-regions which are similar.

Figure 21:
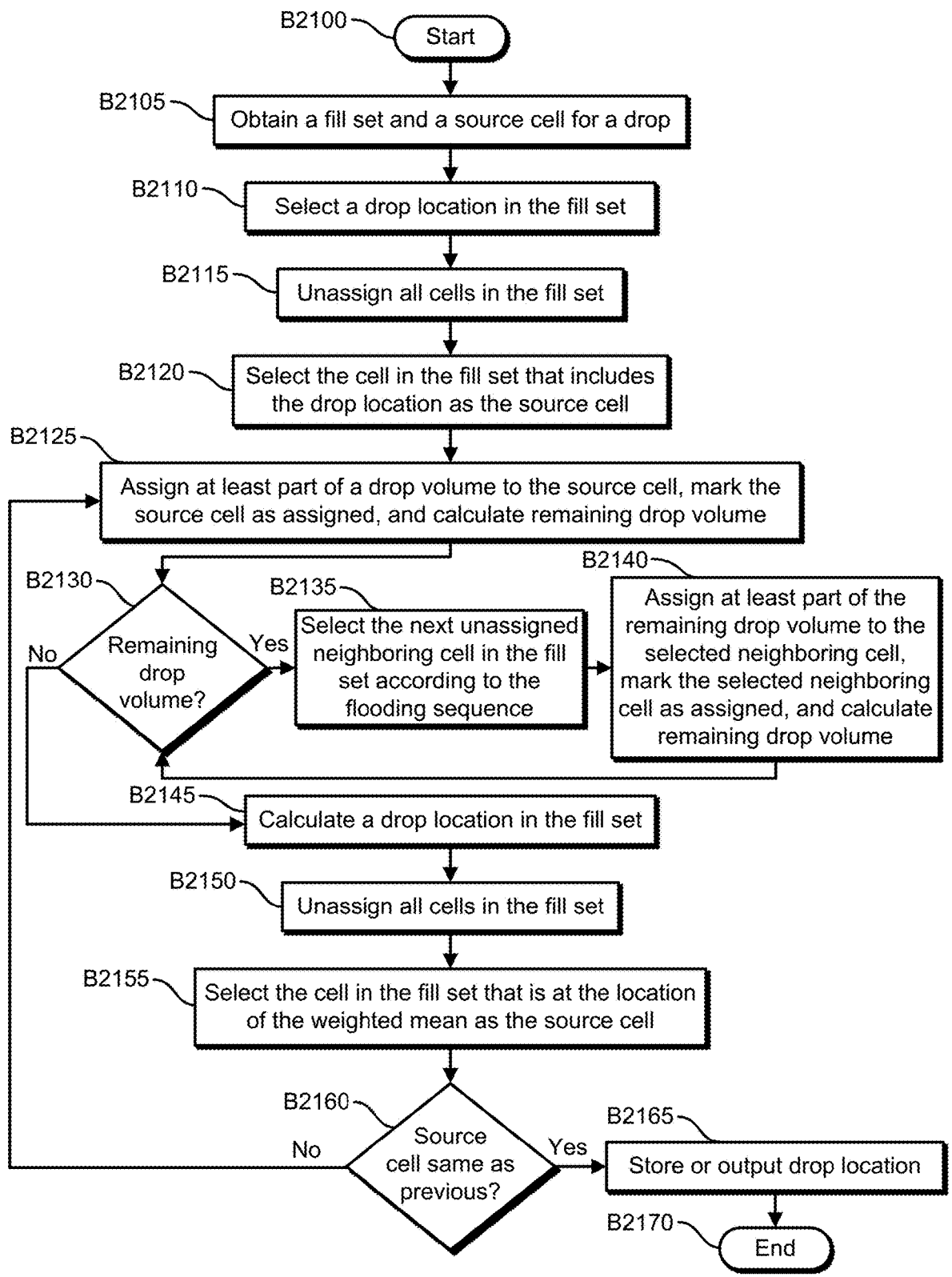
FIG. 21 illustrates an example embodiment of an operational flow for optimizing a drop's location.

In some cases, a quality improvement can be obtained if a few iterations are allowed when selecting a drop location. FIG. 21 illustrates an example embodiment of an operational flow for optimizing a drop's location. The flow starts in block B2100 and then moves to block B2105, where a drop-pattern-generation device obtains a fill set and a source cell for a drop. The fill set includes the cells that have been assigned to the drop. Next, in block B2110, the drop-pattern-generation device selects a drop location in the fill set. For example, some embodiments of the drop-pattern-generation device calculate a weighted mean in the fill set as the drop location (e.g., as described in the example in the description of block B1083 in FIG. 10).

The flow then moves to block B2115, where the drop-pattern-generation device unassigns all cells in the fill set from the drop. The flow then advances to block B2120, where the drop-pattern-generation device selects the cell in the fill set that includes the drop location as the source cell. Then, in block B2125, the drop-pattern-generation device assigns at least part of a drop volume to the source cell, marks the source cell as assigned, and calculates the remaining drop volume.

Next, in block B2130, the drop-pattern-generation device determines whether any drop volume remains. If in block B2130 the drop-pattern-generation device determines that drop volume remains (B2130=Yes), then the flow moves to block B2135. If in block B2130 the drop-pattern-generation device determines that no drop volume remains (B2130=No), then the flow moves to block B2145.

In block B2135, the drop-pattern-generation device selects the next unassigned neighboring cell in the fill set according to the flooding sequence. For example, the drop-pattern-generation device may add the neighboring cells of the currently selected cell (the source cell or the neighboring cell that was selected in the previous iteration of block B2135) to the end of a neighbor list according to the flooding sequence. Then the drop-pattern-generation device may select the next neighboring cell in the neighbor list as the next unassigned neighboring cell. The flow then proceeds to block B2140, where the drop-pattern-generation device assigns at least part of the remaining drop volume to the selected neighboring cell, marks the selected neighboring cell as assigned, and calculates the remaining drop volume. In some embodiments, the drop-pattern-generation device add the neighboring cells of the selected neighboring cell that are in the fill set to the end of the neighbor list according to the flooding sequence (e.g., similar to block B1065 in FIG. 10 or similar to block B1335 in FIG. 13). The flow then returns to block B2130.

In block B2145, the drop-pattern-generation device calculates a drop location in the fill set. Next, in block B2150, the drop-pattern-generation device unassigns all cells in the fill set. Then, in block B2155, the drop-pattern-generation device selects the cell in the fill set that is at the location of the weighted mean as the source cell. The flow then moves to block B2160, where the drop-pattern-generation device determines if the most-recently selected source cell is the same as the previously selected source cell (selected in block B2120 or in a previous iteration of block B2155) or if a number of iterations of blocks B2125-62155 has reached a maximum number of iterations (e.g. 5, 10, 100). If the drop-pattern-generation device determines that the most-recently selected source cell is not the same as the previously selected source cell (B2160=No), then the flow returns to block B2125. If the drop-pattern-generation device determines that the most-recently selected source cell is the same as the previously selected source cell or the number of iterations of blocks B2125-62155 has reached a maximum number of iterations (B2160=Yes), then the flow proceeds to block B2165. In block B2165, the drop-pattern-generation device stores or output the drop location (e.g., adds the drop location to a drop pattern). Then the flow ends in block B2170.

This operational flow is deterministic and does not get stuck in local minima. Also, this operational flow is computationally very efficient to execute because it moves a single drop at a time, and the region size in which it operates (which is defined by the fill set) is significantly smaller than the size of the entire imprint field.

Figure 22:
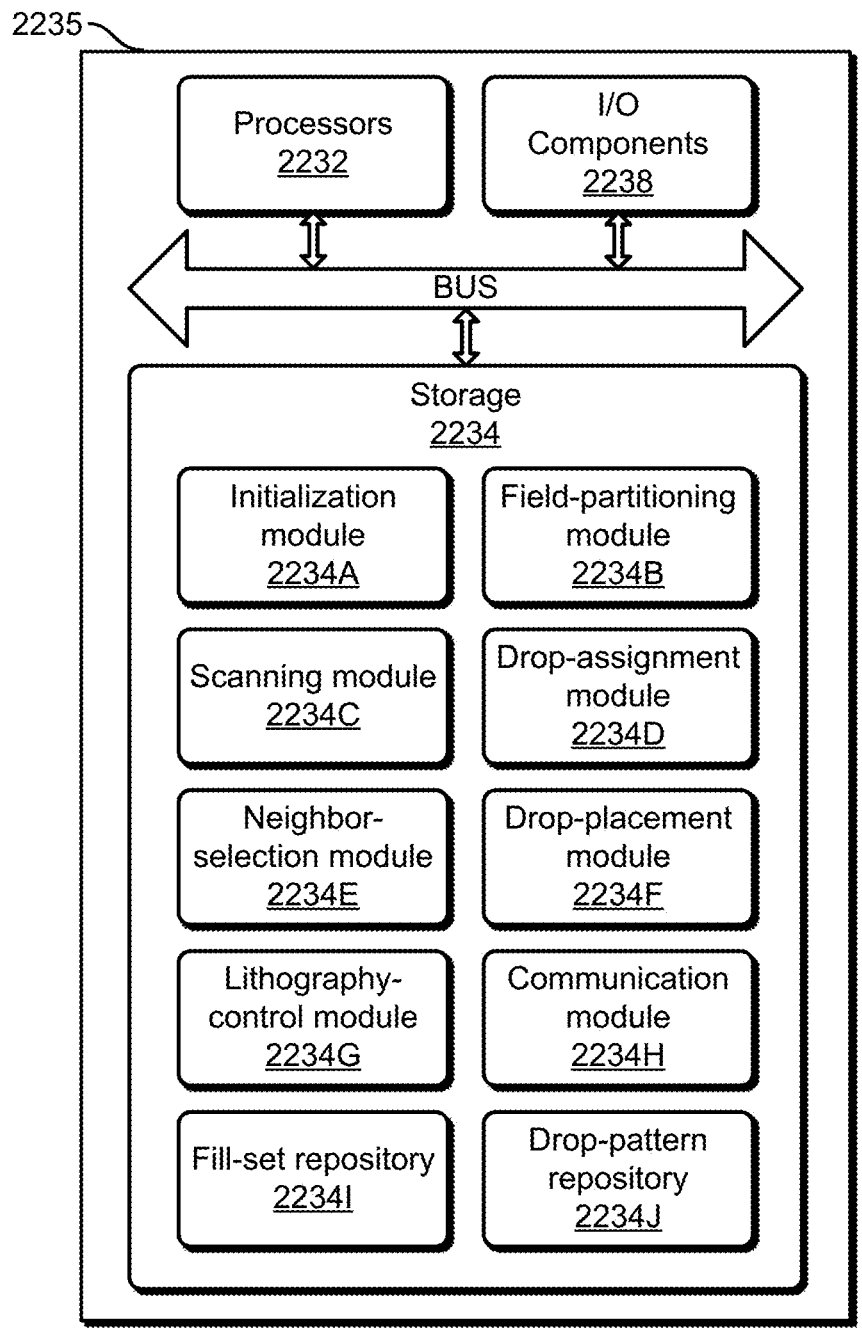
FIG. 22 illustrates an example embodiment of a nanoimprint-lithography-control device.

FIG. 22 illustrates an example embodiment of a drop-pattern-generation device. The drop-pattern-generation device 2235 includes one or more processors 2232, one or more I/O components 2238, and storage 2234. Also, the hardware components of the drop-pattern-generation device 2235 communicate via one or more buses or other electrical connections. Examples of buses include a universal serial bus (USB), an IEEE 1394 bus, a Peripheral Component Interconnect (PCI) bus, a Peripheral Component Interconnect Express (PCIe) bus, an Accelerated Graphics Port (AGP) bus, a Serial AT Attachment (SATA) bus, and a Small Computer System Interface (SCSI) bus.

The one or more processors 2232 include one or more central processing units (CPUs), which may include microprocessors (e.g., a single core microprocessor, a multi-core microprocessor); one or more graphics processing units (GPUs); one or more tensor processing units (TPUs); one or more application-specific integrated circuits (ASICs); one or more field-programmable-gate arrays (FPGAs); one or more digital signal processors (DSPs); or other electronic circuitry (e.g., other integrated circuits). The I/O components 2238 include communication components that communicate with one or more of the following: a substrate positioning stage, an imprint head, a fluid dispenser, an energy source, and a camera. Also, the I/O components 2238 may include communication components (e.g., a graphics card, a network-interface controller) that communicate with a network or with other input or output devices (not illustrated), which may include a display device, a keyboard, a mouse, a printing device, a touch screen, a light pen, an optical-storage device, a scanner, a microphone, a drive, and a controller (e.g., a joystick, a control pad).

The storage 2234 includes one or more computer-readable storage media. As used herein, a computer-readable storage medium includes an article of manufacture, for example a magnetic disk (e.g., a floppy disk, a hard disk), an optical disc (e.g., a CD, a DVD, a Blu-ray), a magneto-optical disk, magnetic tape, and semiconductor memory (e.g., a non-volatile memory card, flash memory, a solid-state drive, SRAM, DRAM, EPROM, EEPROM). The storage 2234, which may include both ROM and RAM, can store computer-readable data or computer-executable instructions.

The drop-pattern-generation device 2235 also includes an initialization module 2234A, a field-partitioning module 2234B, a scanning module 2234C, a drop-assignment module 2234D, a neighbor-selection module 2234E, a drop-placement module 2234F, a lithography-control module 2234G, and a communication module 2234H. A module includes logic, computer-readable data, or computer-executable instructions. In the embodiment shown in FIG. 22, the modules are implemented in software (e.g., Assembly, C, C++, C #, Java, BASIC, Perl, Visual Basic). However, in some embodiments, the modules are implemented in hardware (e.g., customized circuitry) or, alternatively, a combination of software and hardware. When the modules are implemented, at least in part, in software, then the software can be stored in the storage 2234. Also, some embodiments of the drop-pattern-generation device 2235 include additional modules, omit some of these modules, combine these modules into fewer modules, or divide these modules into more modules. Additionally, the drop-pattern-generation device 2235 includes a fill-set repository 2234I and a drop-pattern repository 2234J. The fill-set repository 2234I stores fill sets, and the drop-pattern repository 2234J stores drop patterns.

The initialization module 2234A includes instructions that cause the drop-pattern-generation device 2235 to obtain (e.g., set, receive) a drop volume, obtain a field material map, obtain a scanning sequence, obtain a flooding sequence, and initialize variables. For example, some embodiments of the initialization module 2234A include instructions that cause the drop-pattern-generation device 2235 to perform at least some of the operations that are described in blocks B405-6410 in FIG. 4, in blocks B705-6710 in FIG. 7, in blocks B1005-61015 in FIG. 10, or in blocks B2005-B2015 in FIG. 20.

The field-partitioning module 2234B includes instructions that cause the drop-pattern-generation device 2235 to partition a field material map into cells and to determine a respective cell volume for each cell. For example, some embodiments of the field-partitioning module 2234B include instructions that cause the drop-pattern-generation device 2235 to perform at least some of the operations that are described in blocks B415-6420 in FIG. 4, in blocks B715-6720 in FIG. 7, in blocks B1020-61035 in FIG. 10, or in blocks B2020-62035 in FIG. 20.

The scanning module 2234C includes instructions that cause the drop-pattern-generation device 2235 to scan, according to a scanning sequence, a set of cells for an unassigned cell or to select a source cell. For example, some embodiments of the scanning module 2234C include instructions that cause the drop-pattern-generation device 2235 to perform at least some of the operations that are described in blocks B425 and B445 in FIG. 4, in blocks B725 and B750-6760 in FIG. 7, in blocks B1040 and B1071-61077 in FIG. 10, in block B1305 in FIG. 13, in block B1705 in FIG. 17, or in blocks B2040 and B2071-62077 in FIG. 20.

The drop-assignment module 2234D includes instructions that cause the drop-pattern-generation device 2235 to assign drop volumes to cells, mark cells as assigned, add cells to fill sets, or calculate remaining drop volumes. For example, some embodiments of the drop-assignment module 2234D include instructions that cause the drop-pattern-generation device 2235 to perform at least some of the operations that are described in blocks B430-6440 in FIG. 4, in blocks B730 and B745 in FIG. 7, in blocks B1045 and B1060 in FIG. 10, in blocks B1310 and B1330 in FIG. 13, in blocks B1710 and B1730 in FIG. 17, in blocks B2045 and B2065 in FIG. 20, or in blocks B2125 and B2140 in FIG. 21. Also, the fill sets may be stored in the fill-set repository 2234I.

The neighbor-selection module 2234E includes instructions that cause the drop-pattern-generation device 2235 to add one or more neighboring cells to a neighbor list, which may be performed according to a flooding sequence. For example, some embodiments of the neighbor-selection module 2234E include instructions that cause the drop-pattern-generation device 2235 to perform at least some of the operations that are described in block B440 in FIG. 4, in blocks B735-6740 in FIG. 7, in blocks B1047-B1055 and B1065-61070 in FIG. 10, in blocks B1315-61325 and B1335-61340 in FIG. 13, in blocks B1715-61725 and B1735-61745 in FIG. 17, in blocks B2050-62060 and B2070 in FIG. 20, or in blocks B2130-62135 in FIG. 21.

The drop-placement module 2234F includes instructions that cause the drop-pattern-generation device 2235 to determine respective drop locations for drops based on the cells that are in the respective fill sets of the drops (the cells that have been assigned to the drops) and to generate drop patterns based on the drop locations. For example, some embodiments of the drop-placement module 2234F include instructions that cause the drop-pattern-generation device 2235 to perform at least some of the operations that are described in block B450 in FIG. 4, in block B765 in FIG. 7, in blocks B1081-61090 in FIG. 10, in blocks B2081-62090 in FIG. 20, or in blocks B2105-62120 and B2145-62165 in FIG. 21.

The lithography-control module 2234G includes instructions that cause the drop-pattern-generation device 2235 to regulate, control, or direct other components or subsystems of a nanoimprint lithography system, such a substrate positioning stage, an imprint head, a fluid dispenser, an energy source, and a camera.

The communication module 2234H includes instructions that cause the drop-pattern-generation device 2235 to communicate with one or more other devices (e.g., a nanoimprint-lithography-control device, a substrate positioning stage, an imprint head, a fluid dispenser, an energy source, a camera, a monitor, another computing device).

At least some of the above-described devices, systems, and methods can be implemented, at least in part, by providing one or more computer-readable media that contain computer-executable instructions for realizing the above-described operations to one or more computing devices that are configured to read and execute the computer-executable instructions. The systems or devices perform the operations of the above-described embodiments when executing the computer-executable instructions. Also, an operating system on the one or more systems or devices may implement at least some of the operations of the above-described embodiments.

Furthermore, some embodiments use one or more functional units to implement the above-described devices, systems, and methods. The functional units may be implemented in only hardware (e.g., customized circuitry) or in a combination of software and hardware (e.g., a microprocessor that executes software).

The invention claimed is:

1. A method of generating a drop pattern, the method comprising:
   (a) receiving a predetermined fluid drop volume and an array of cells corresponding to a desired fill area, wherein each cell in the array is associated with a respective predetermined fluid volume, and wherein each cell has a hexagonal shape;
   (b) scanning the array of cells according to a scanning sequence for a next unassigned cell and adding the next unassigned cell in the scanning sequence to a respective fill set of the next unassigned cell;
   (c) adding unassigned cells neighboring the next unassigned cell to the respective fill set until an aggregate of the respective predetermined fluid volumes of the cells in the respective fill set equals or exceeds the predetermined fluid drop volume;

(d) placing a fluid drop in the drop pattern within an area associated with the respective fill set and marking all cells in the respective fill set as assigned; and (e) repeating (b)-(d) until all cells in the array of cells have been assigned and the drop pattern has been generated.

2. The method of claim 1, wherein (c) is performed recursively.

3. The method of claim 1, wherein (c) is performed according to a flooding sequence.

4. The method of claim 3, wherein the scanning sequence visits each cell in the array of cells, and visits each cell in the array of cells only once.

5. The method of claim 1, wherein the respective predetermined fluid volume of each cell in the array is less than the predetermined fluid drop volume.

6. The method of claim 1, wherein (c) includes:
adding the unassigned cells neighboring the next unassigned cell to a neighbor list, wherein the neighbor list defines an order of the unassigned neighboring cells in the neighbor list; and
according to an order of the unassigned neighboring cells in the neighbor list,
assigning at least part of the predetermined fluid drop volume to a next unassigned neighboring cell in the neighbor list,
adding unassigned neighboring cells of the next unassigned neighboring cell to the neighbor list, and
calculating a remaining predetermined fluid drop volume.

7. The method of claim 6, wherein the unassigned neighboring cells of the next unassigned neighboring cell are added to an end of the neighboring list.

8. The method of claim 1, further comprising:
supplying formable material to a substrate in accordance with the drop pattern;
imprinting the formable material on the substrate with a template; and
manufacturing an article by processing the substrate on which the formable material has been imprinted.

9. An apparatus comprising:
a substrate chuck configured to hold a substrate;
a dispenser configured to supply formable material onto the substrate; and
a controller configured to control the dispenser in accordance with a drop pattern of the formable material that indicates drop locations where respective drops of the formable material are to be supplied onto the substrate, wherein the controller is further configured to:
(a) receive a fluid drop volume and an array of hexagonal cells corresponding to a desired fill area, wherein each cell in the array is associated with a respective fluid volume;
(b) scan the array of hexagonal cells according to a scanning sequence and assigning a first unassigned hexagonal cell in the scanning sequence to a fill set;
(c) recursively assign unassigned cells neighboring each assigned cell to the fill set until an aggregate of the respective fluid volumes of the cells in the fill set equals or exceeds the drop volume;
(d) place a fluid drop in the drop pattern within an area associated with the fill set; and
(e) repeat steps (b)-(d) until all the cells in the array have been assigned and the drop pattern is generated.

10. The apparatus of claim 9, wherein (d) includes calculating a location of a weighted mean of the respective fluid volumes of the cells in the fill set, and wherein the fluid drop of the fill set is placed at the location of the weighted mean.

11. The apparatus of claim 9, wherein the scanning sequence visits each cell in the array once and only once.

12. The apparatus of claim 9, wherein (c) includes adding the unassigned cells neighboring each assigned cell to a neighbor list.

13. The apparatus of claim 12, wherein the unassigned cells neighboring each assigned cell are added to the neighbor list according to a flooding sequence.

14. The apparatus of claim 13, wherein the flooding sequence is isotropic.

15. The apparatus of claim 13, wherein the flooding sequence is anisotropic.

16. One or more computer-readable storage media storing instructions that, when executed by one or more computing devices, cause the one or more computing devices to perform operations comprising:
receiving a predetermined fluid drop volume and an array of cells corresponding to a desired fill area, wherein each cell in the array is associated with a respective predetermined fluid volume;
scanning the array of cells according to a scanning sequence for a next unassigned cell, adding the next unassigned cell in the scanning sequence to a respective fill set of the next unassigned cell, marking the next unassigned cell as assigned, and calculating a remaining drop volume;
adding unassigned neighboring cells of the next unassigned cell to a neighbor list, wherein the neighbor list defines an order of the unassigned neighboring cells;
repeatedly performing the following until the remaining drop volume is less than or equal to zero:
adding a next unassigned neighboring cell in the neighbor list to the fill set,
marking the next unassigned neighboring cell as assigned,
adding unassigned neighboring cells of the next unassigned neighboring cell to the neighbor list, and
recalculating the remaining drop volume;
selecting a drop location in the cells in the fill set; and
adding the drop location to a drop pattern.

17. The one or more computer-readable storage media of claim 16, wherein the array of cells is a tessellation of hexagonal cells.

18. The one or more computer-readable storage media of claim 16, wherein unassigned neighboring cells of the next unassigned cell include unassigned cells that abut the next unassigned cell.

19. The one or more computer-readable storage media of claim 16, wherein unassigned neighboring cells of the next unassigned cell include unassigned cells that do not abut the next unassigned cell.

20. The one or more computer-readable storage media of claim 16, wherein the operations further comprise:
receiving a second predetermined fluid drop volume, wherein the second predetermined fluid drop volume is less than the predetermined fluid drop volume;
(b) scanning the array of cells according to the scanning sequence for the next unassigned cell, adding the next unassigned cell in the scanning sequence to a respective fill set of the next unassigned cell, marking the next unassigned cell as assigned, and calculating a remaining drop volume of the second predetermined fluid drop volume;

(c) adding unassigned neighboring cells of the next unassigned cell to a neighbor list, wherein the neighbor list defines an order of the unassigned neighboring cells;
(d) repeatedly performing the following until the remaining drop volume of the second predetermined fluid drop volume is less than or equal to zero:
   adding a next unassigned neighboring cell in the neighbor list to the fill set,
   marking the next unassigned neighboring cell as assigned,
   adding unassigned neighboring cells of the next unassigned neighboring cell to the neighbor list, and
   recalculating the remaining drop volume of the second predetermined fluid drop volume;
(e) selecting a drop location in the cells in the fill set; and
(f) adding the drop location to a drop pattern.

* * * * *